(12) United States Patent
Nelson et al.

(10) Patent No.: US 10,725,069 B1
(45) Date of Patent: Jul. 28, 2020

(54) INTEGRATED CIRCUIT CONTACTOR FOR TESTING ICS AND METHOD OF CONSTRUCTION

(71) Applicant: Johnstech International Corporation, Minneapolis, MN (US)

(72) Inventors: John Nelson, Brooklyn Park, MN (US); Ranauld Perez, North Hills, CA (US); Jeffrey Sherry, Savage, MN (US); Michael Andres, Inver Grove Heights, MN (US); David Johnson, Wayzata, MN (US)

(73) Assignee: JOHNSTECH INTERNATIONAL CORPORATION, Minneapolis, MN (US)

( * ) Notice: Subject to any disclaimer, the term of this patent is extended or adjusted under 35 U.S.C. 154(b) by 0 days.

(21) Appl. No.: 16/134,346

(22) Filed: Sep. 18, 2018

Related U.S. Application Data

(60) Provisional application No. 62/560,380, filed on Sep. 19, 2017.

(51) Int. Cl.
*G01R 1/04* (2006.01)
*G01R 31/28* (2006.01)
*G01R 1/073* (2006.01)

(52) U.S. Cl.
CPC ....... *G01R 1/0466* (2013.01); *G01R 1/07378* (2013.01); *G01R 31/2889* (2013.01)

(58) Field of Classification Search
CPC ............. G01R 1/0466; G01R 31/2889; G01R 1/07378
See application file for complete search history.

(56) References Cited

U.S. PATENT DOCUMENTS

| | | | |
|---|---|---|---|
| 5,812,378 A | 9/1998 | Fjelstad et al. | |
| 6,246,249 B1 | 6/2001 | Fukasawa et al. | |
| 9,007,082 B2 | 4/2015 | Nelson et al. | |
| 9,261,537 B2 | 2/2016 | Edwards et al. | |
| 9,817,026 B2 | 11/2017 | Edwards et al. | |
| 2001/0011907 A1 | 8/2001 | Farnworth et al. | |
| 2003/0192181 A1 | 10/2003 | Fjelstad et al. | |
| 2004/0201390 A1 | 10/2004 | Farnworth et al. | |
| 2007/0202714 A1 | 8/2007 | Sherry | |
| 2009/0269549 A1* | 10/2009 | Fujita | H01R 13/035 428/137 |
| 2010/0197152 A1* | 8/2010 | Naito | G01R 1/0466 439/71 |
| 2012/0122355 A1* | 5/2012 | Hemmi | G01R 1/06722 439/816 |
| 2012/0244728 A1* | 9/2012 | Rathburn | H01C 1/14 439/83 |
| 2013/0078829 A1* | 3/2013 | Wertz | H01R 12/714 439/78 |

(Continued)

*Primary Examiner* — Alvaro E Fortich
(74) *Attorney, Agent, or Firm* — Hamre, Schumann, Mueller & Larson, P.C.

(57) ABSTRACT

The terminals of a device under test (DUT) are temporarily electrically connected to corresponding contact pads on a load board by a series of electrically conductive pin pairs. The pin pairs are protected against damage from balls on a DUT by a protective ball guide which includes recesses for receiving part of the ball but prevents the ball from driving the pins beyond a limited range. The ball guide provides fine alignment horizontally and vertically enabling stable electrical performance.

16 Claims, 38 Drawing Sheets

(56) References Cited

U.S. PATENT DOCUMENTS

2015/0084658 A1* 3/2015 Lee ................. G01R 1/0466
                                            324/750.24
2019/0206750 A1* 7/2019 Chen ................ G01R 1/07307

* cited by examiner

INTEGRATED CIRCUIT CONTACTOR FOR TESTING ICS AND METHOD OF CONSTRUCTION

BACKGROUND OF THE INVENTION

Field of the Invention

The present disclosure is directed to equipment for testing microcircuits.

Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once the microcircuit is mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the device under test and the electrical pads on the load board. When the device under test is forced into contact with the tester, the pins complete the circuits between respective device under test contacts and corresponding load board pads. After testing, when the device under test is released, the terminals separate from the pins and the circuits are broken.

The present application is directed to improvements to these pins.

There is a type of testing known as "Kelvin" testing, which measures the resistance between two terminals on the device under test. Basically, Kelvin testing involves forcing a current to flow between the two terminals, measuring the voltage difference between the two terminals, and using Ohm's Law to derive the resistance between the terminals, given as the voltage divided by the current. Each terminal on the device under test is electrically connected to two contact pads on the load board. One of the two pads supplies a known current amount of current. The other pad is a high-impedance connection that acts as a voltmeter, which does not draw any significant amount of current. In other words, each terminal on the device under test that is to undergo Kelvin testing is simultaneously electrically connected to two pads on the load board—one pad supplying a known amount of current and the other pad measuring a voltage and drawing an insignificant amount of current while doing so. The terminals are Kelvin tested two at a time, so that a single resistance measurement uses two terminals on the load board and four contact pads.

In this application, the pins that form the temporary electrical connections between the device under test and the load board may be used in several manners. In a standard (non-kelvin) test, each pin connects a particular terminal on the device under test to a particular pad on the load board, with the terminals and pads being in a one-to-one relationship. For these standard tests, each terminal corresponds to one pad, and each pad corresponds to one terminal.

There are many aspects of the testbeds that may be incorporated from older or existing testbeds. For instance, much of the mechanical infrastructure and electrical circuitry may be used from existing test systems, and may be compatible with the electrically conductive pins disclosed herein. Such existing systems are listed and summarized below.

An exemplary microcircuit tester is disclosed in United States Patent Application Publication Number US 2007/0202714, titled "Test Contact System For Testing Integrated Circuits With Packages Having An Array Of Signal And Power Contacts", invented by Jeffrey C. Sherry, published on Aug. 30, 2007 and incorporated by reference herein in its entirety.

For the tester of '714, a series of microcircuits is tested sequentially, with each microcircuit, or "device under test", being attached to a testbed, tested electrically, and then removed from the testbed. The mechanical and electrical aspects of such a testbed are generally automated, so that the throughput of the testbed may be kept as high as possible.

In '714, a test contact element for making temporary electrical contact with a microcircuit terminal comprises at least one resilient finger projecting from an insulating contact membrane as a cantilevered beam. The finger has on a contact side thereof, a conducting contact pad for contacting the microcircuit terminal. Preferably the test contact element has a plurality of fingers, which may advantageously have a pie-shaped arrangement. In such an arrangement, each finger is defined at least in part by two radially oriented slots in the membrane that mechanically separate each finger from every other finger of the plurality of fingers forming the test contact element.

In '714, a plurality of the test contact elements can form a test contact element array comprising the test contact elements arranged in a predetermined pattern. A plurality of connection vias are arranged in substantially the predetermined pattern of the test contacts elements, with each of said connection vias is aligned with one of the test contact elements. Preferably, an interface membrane supports the plurality of connection vias in the predetermined pattern. Numerous vias can be embedded into the pie pieces away from the device contact area to increase life. Slots separating fingers could be plated to create an I-beam, thereby preventing fingers from deforming, and also increasing life.

The connection vias of '714 may have a cup shape with an open end, with the open end of the cup-shaped via contacting the aligned test contact element. Debris resulting from loading and unloading DUTs from the test equipment can fall through the test contact elements where the cup-shaped vias impound the debris.

The contact and interface membranes of '714 may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

In '714, the device uses a very thin conductive plate with retention properties that adheres to a very thin non-conductive insulator. The metal portion of the device provides multiple contact points or paths between the contacting I/O and the load board. This can be done either with a plated via hole housing or with plated through hole vias, or bumped surfaces, possibly in combination with springs, that has the first surface making contact with the second surface, i.e., the device I/O. The device I/O may be physically close to the load board, thus improving electrical performance.

One particular type of microcircuit often tested before installation has a package or housing having what is commonly referred to as a ball grid array (BGA) terminal arrangement. A typical BGA package may have the form of a flat rectangular block, with typical sizes ranging from 5 mm to 40 mm on a side and 1 mm thick.

A typical microcircuit has a housing enclosing the actual circuitry. Signal and power (S&P) terminals are on one of the two larger, flat surfaces, of the housing. Typically, terminals occupy most of the area between the surface edges and any spacer or spacers. Note that in some cases, a spacer may be an encapsulated chip or a ground pad.

Each of the terminals may include a small, approximately spherical solder ball that firmly adheres to a lead from the internal circuitry penetrating surface, hence the term "ball grid array." Each terminal and spacer projects a small distance away from the surface, with the terminals projecting farther from the surface than the spacers. During assembly, all terminals are simultaneously melted, and adhere to suitably located conductors previously formed on the circuit board.

The terminals themselves may be quite close to each other. Some have centerline spacings of as little as 0.3 mm, and even relatively widely spaced terminals may still be around 1.5 mm apart. Spacing between adjacent terminals is often referred to as "pitch."

In addition to the factors mentioned above, BGA microcircuit testing involves additional factors.

First, in making the temporary contact with the ball terminals, the tester should not damage the S&P terminal surfaces that contact the circuit board, since such damage may affect the reliability of the solder joint for that terminal.

Second, the testing process is more accurate if the length of the conductors carrying the signals is kept short. An ideal test contact arrangement has short signal paths.

Third, solders commonly in use today for BGA terminals are mainly tin for environmental purposes. Tin-based solder alloys are likely to develop an oxide film on the outer surface that conducts poorly. Older solder alloys include substantial amounts of lead, which do not form oxide films. The test contacts must be able to penetrate the oxide film present.

Fourth, the thickness of the device body and the ball are manufactured to a large tolerance relative to the length of the contact signal path. To make temporary contact with ball terminals within the proper force range, the contacts traditionally require a large compliant range to accommodate this tolerance. However, as the contact signal paths are made shorter, it becomes very difficult to provide the large compliant range while maintaining contact robustness for adequate product life due to the reduced length of the contacts.

Fifth, during the production testing process a robotic arm presents the device to the contacts for electrical test. This robotic arm sometimes fails to remove a device from the contacts and attempts to present a second device to the contacts for testing, thus applying a significant load to the socket. Also, in some cases the robotic arm unintentionally inserts devices at incorrect orientations which can cause damage to the contact tips.

BGA test contacts currently known and used in the art employ spring pins made up of multiple pieces including a spring, a body and top and bottom plungers. The many components and longer signal length are not optimal for high frequency testing.

United States Patent Application Publication No. 2003/0192181, titled "Method Of Making An Electronic Contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

According to United States Patent Application Publication No. 2004/0201390, titled "Test Interconnect For Bumped Semiconductor Components And Method Of Fabrication" and published on Oct. 14, 2004, an interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches topography of the bumped contacts. The leads can be formed by forming a patterned metal layer on the substrate, by attaching a polymer substrate with the leads thereon to the substrate, or by etching the substrate to form conductive beams.

According to U.S. Pat. No. 6,246,249 titled "Semiconductor Inspection Apparatus And Inspection Method Using The Apparatus" and issued on Jun. 12, 2001 to Fukasawa et. al., a semiconductor inspection apparatus performs a test on a to-be-inspected device which has a spherical connection terminal. This apparatus includes a conductor layer formed on a supporting film. The conductor layer has a connection portion. The spherical connection terminal is connected to the connection portion. At least a shape of the connection portion is changeable. The apparatus further includes a shock absorbing member, made of an elastically deformable and insulating material, for at least supporting the connection portion. A test contact element of the disclosure for making temporary electrical contact with a microcircuit terminal comprises at least one resilient finger projecting from an insulating contact membrane as a cantilevered beam. The finger has on a contact side thereof, a conducting contact pad for contacting the microcircuit terminal.

In U.S. Pat. No. 5,812,378 titled "Microelectronic Connector For Engaging Bump Leads" and issued on Sep. 22, 1998 to Fjelstad et. al., a connector for microelectronic includes a sheet-like body having a plurality of holes, desirably arranged in a regular grid pattern. Each hole is provided with a resilient laminar contact such as a ring of a sheet metal having a plurality of projections extending inwardly over the hole of a first major surface of the body. Terminals on a second surface of the connector body are electrically connected to the contacts. The connector can be attached to a substrate such a multi-layer circuit panel so that the terminals on the connector are electrically connected to the leads within the substrate. Microelectronic elements having bump leads thereon may be engaged with the connector and hence connected to the substrate, by advancing the bump leads into the holes of the connector to engage the bump leads with the contacts. The assembly can be tested, and if found acceptable, the bump leads can be permanently bonded to the contacts.

According to United States Patent Application Publication No. 2001/0011907 titled "Test Interconnect For Bumped Semiconductor Components And Method Of Fabrication" and published on Aug. 9, 2001, an interconnect for testing semiconductor components includes a substrate, and contacts on the substrate for making temporary electrical connections with bumped contacts on the components. Each contact includes a recess and a support member over the recess configured to electrically engage a bumped contact. The support member is suspended over the recess on spiral leads formed on a surface of the substrate. The spiral leads allow the support member to move in a z-direction within the recess to accommodate variations in the height and planarity of the bumped contacts. In addition, the spiral leads twist the support member relative to the bumped contact to facilitate penetration of oxide layers thereon. The spiral leads can be formed by attaching a polymer substrate with the leads thereon to the substrate, or by forming a patterned metal layer on the substrate. In an alternate embodiment contact, the support member is suspended over the surface of the substrate on raised spring segment leads.

U.S. Pat. Nos. 9,007,082 and 9,261,537 are hereby incorporated by reference for background material to avoid the need to restate concepts.

DETAILED DESCRIPTION OF THE INVENTION

Figure 1:
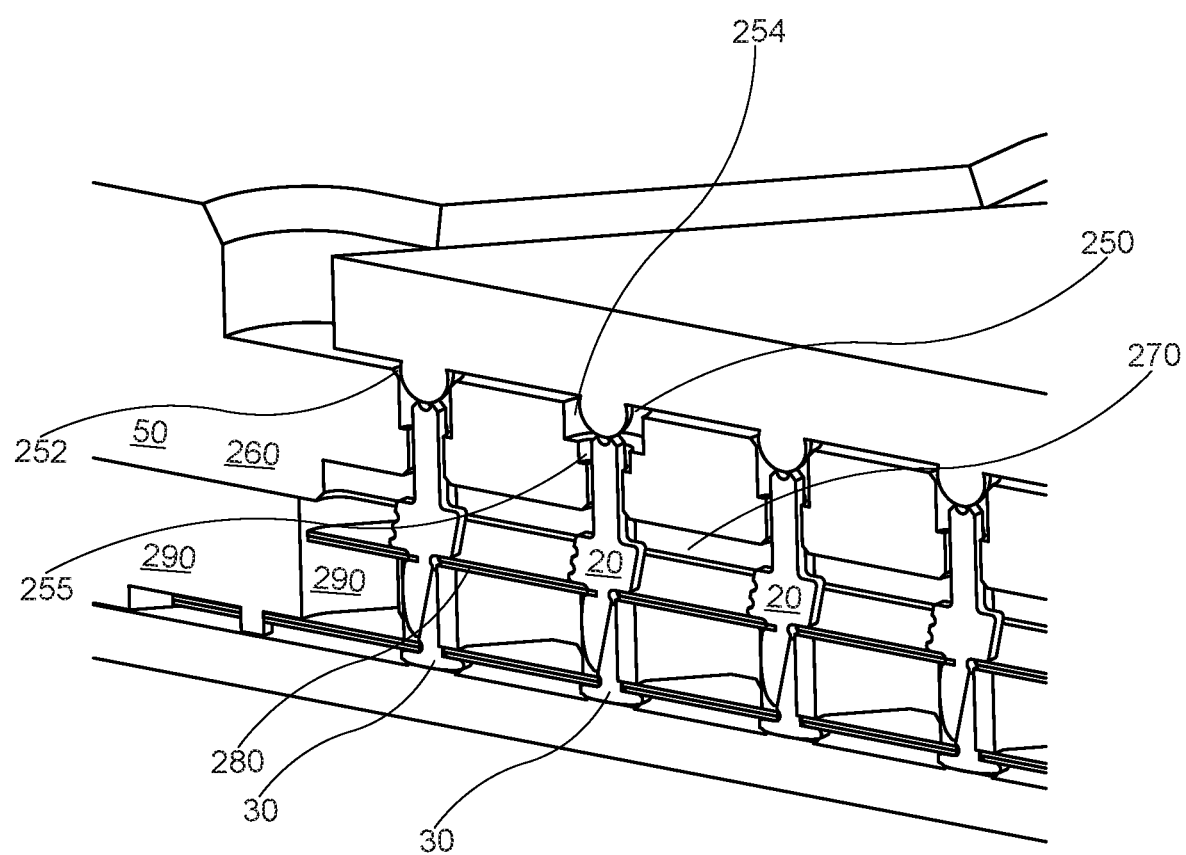
FIG. 1 a sectional perspective view of a plurality of pins (upper 20, lower 30) contacting a DUT ball 2, with an interposer 50.

To the extent that a reference numeral is not defined herein, reference should be had to U.S. Pat. No. 9,261,537 which may have the same reference numeral and the component labels as in '537, though not the same description. When a robotic hander inserts a BGA IC into a test socket, there is always the possibility of causing damage to the (solder) balls on the array due to misalignment or over-force. This will either destroy/damage the IC, damage the test socket or result in a unreliable test, or all of the above. By creating a receiver which can accommodate all or part of the ball contact but limit its penetration into the test socket and test pins, these adverse occurrences are minimized.

This disclosure is a test socket assembly used with a BGA or eWLB (together referred to as BGA) type package device under test (DUT) and a printed circuit board (PCB). The test socket makes temporary electrical contact between the DUT and the PCB. It is unique because the previously vulnerable cartridge, which holds the pin pairs and elastomer, is now protected by a floating ball guide for package test. In addition to protecting the cartridge, the floating ball guide provides a hardstop for the DUT that limits the travel of the DUT ball and/or DUT body which makes the contact overdrive repeatable.

This test socket includes any or all of the following:

a) a housing aligns the contactor to the PCB. It is a generally rigid structure with mounting and alignment features near the corners and a passage near the center where the cartridge is received.

b) a cartridge includes:
  i) PCB side contact;
    (1) an alternate contact with interlocking structure improves high frequency signal integrity by ensuring that the wedge to wedge interface is mated and motion is coplanar.
  ii) DUT side probe;
    (1) the preferred geometry is conductive wedge-cross bar-stem-sharp tip.
    (2) an alternate geometry is more uniform section to minimize impedance mismatch.
    (3) an alternate is insulated coating on contact to control signal loss to the guide plate and neighbor probes.
    (4) an alternate tip geometry is multi finger/times which provides wipe action on DUT ball rather than penetration.
  iii) elastomeric member;
    (1) an elastomeric/silicone slab with a pattern of recesses that bias the probes on the DUT balls.
    (2) the elastomeric member can be made with spheres embedded.
    (3) the elastomer can be modified on DUT and/or PCB side to achieve anti-intrusion by the pin body.
    (4) the elastomeric member can be made with wires embedded.
    (5) coil springs may be used for the elastomer or individual O-rings around the pin pairs
  iv) using retaining layers align the contacts to each other and prevent intrusion of the probe to the elastomer.
    (1) use of polyester or polyimide film with a pattern of through features to accept the DUT side probe.
    (2) an alternate method of preventing intrusion of the probe to the elastomer is to use independent film donuts/rings for each probe instead of one continuous anti-intrusion layer.
    (3) a retainer/anti-intrusion layer may be made of polyimide or equivalent with metallic layer sandwiched between non-conductive layers. This provides a second electrical path to the probe that can be used for redundant paths, high precision analog measurements, or additional current carrying capability.

c) the floating guide plate provides lateral alignment of the DUT to the cartridge and limits the vertical travel of the DUT.
  i) in the preferred embodiment, the guide plate is made of insulative plastic or ceramic structure with a wide opening for the DUT giving way to sloped faces for coarse alignment. There is a pocket at the bottom with a pattern of countersink, counter bore, or other alignment features for each DUT ball. Blind holes are located at the corners for return springs or other biasing structures (like an elastomer) to provide the "floating" effect.
  ii) an alternate embodiment has unique c-sink or counter bores at high frequency signal locations for air gap. An alternate embodiment has insulative plastic or ceramic structure with metallization on surface in a pattern that shields signals and connects to ground locations
  iii) another variation is as above but the material is conductive metal and a coating is selectively applied to maintain electrical isolation.
  iv) ball guide limits vertical travel to protect and optimize the performance of the cartridge. This improvement accurately controls the vertical travel yielding consistent performance over the life of the contactor.

d) the plate may have metal structure with insulative inserts at signal locations.

FIG. 1 illustrates a perspective view of a plurality of pins (upper 20, lower 30) contacting a DUT ball 2, with an interposer 50. The interposer has a plurality of recesses 250 sized to receive balls 2 (in the case of a ball grid array—BGA IC), some recesses being oversized 254 and alternatively, some being beveled 252 to provide a ball stop. The recesses can be cylindrical or have a beveled recess or an arcuate recess in place of the bevel shown. Arcuate can be a partial spherical shape generally approximating the ball on a BGA. These shapes create ball stop limiters to prevent the ball from damaging the pin which is engaged.

The apertures/recesses in the ball guide are preferably sized to receive at least part a ball contact but small enough to prevent the entire ball contact from passing therethrough. The depth of the recesses is less than the height of the ball contacts off the DUT, so that only part of the ball contact may engage the ball guide.

The ball stop limits DUT ball z-direction (up-down into the test socket) travel, and causes pin 20 to be deflected/compressed to a more repeatable height than it would be if the device z-direction travel was controlled simply by the robotic chip inserter's arm overdrive/sensor setting. Controlling the z-direction travel with the ball stop improves repeatability by removing the relatively large tolerances of the DUT body thickness and ball protrusion from the overdrive tolerance stack. Instead the balls are pushed into the ball stop until the robotic arm senses a critical force threshold is met.

This ball guide 260 may sit atop an elastomeric layer 290 which provides resilience to the ball guide. A robotic arm chip inserter may not insert with just the right force. Some of the shock can be absorbed in the resilient layer, but the balls themselves are also constrained by the counter-bores which prevent the balls from driving the pins too deeply into their package.

The apertures/counter-bores are sized to receive at least part a ball contact but small enough to prevent the entire ball contact from passing therethrough.

By setting that force threshold higher than the force required to fully compress the floating ball guide, the device ball will be repeatedly compressed to the same height above the load board.

Interposer includes several parts. The top layer 260, which may be a floating ball guide, includes a plurality of recesses 252 or 254 sized to permit pins 20 to extend therethrough and to allow balls 2 to be seated in the plurality of recesses 252/254 which may be double counter-bored with recess 255. The floating ball guide may engage the DUT with a force opposite the direction of the robotics arm travel prior to the DUT ball touching the electrical contacts. This preliminary engagement with the floating ball guide protects the contact pins from the initial impact of the device and extends the contact life. An up-stop layer 270, below 260, may be provided to prevent the pin 20 from traveling into layer 260 in response to compressive forces on the pin pair tending to drive the upper pin upwardly. A downstop layer 280 prevents the pin from directly engaging the elastomeric layer 290.

Elastomeric layer 290 may be a solid portion except in the area of the pins where it is preferably a honeycomb which has apertures for pins 20/30 but also provides the force which keeps these pins in slidable engagement with each other. The honeycomb pattern includes expansion spaces to allow pin pairs to expand laterally as they slide by each other.

Figure 2:
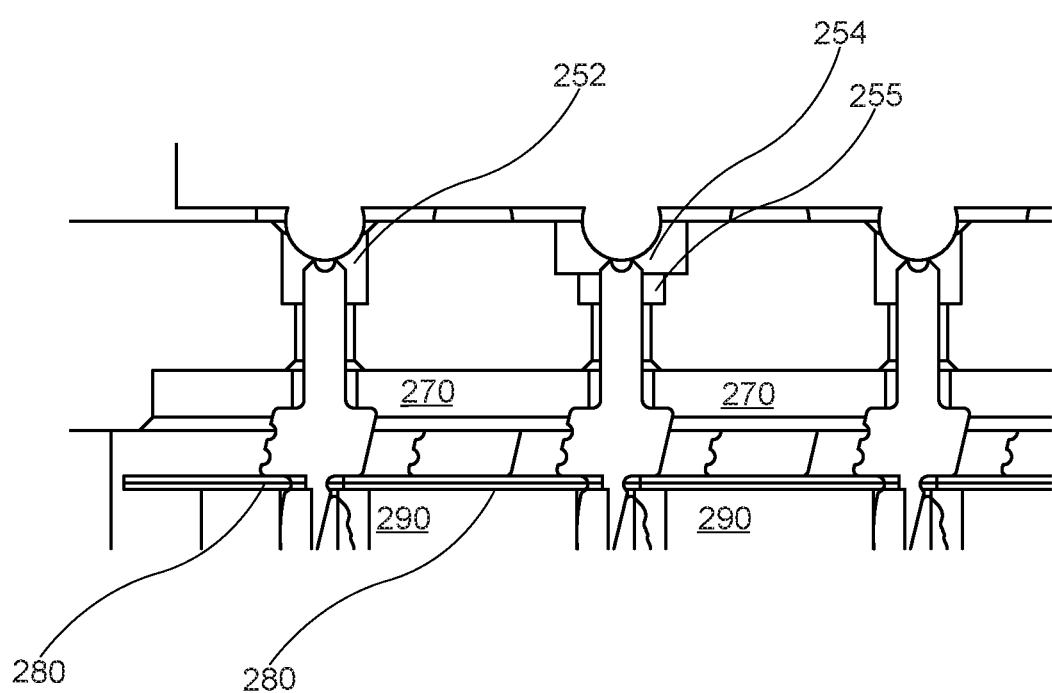
FIG. 2 illustrates a plan sectional view of FIG. 1.

FIG. 2 illustrates a plan sectional view of FIG. 1.

Figure 3:
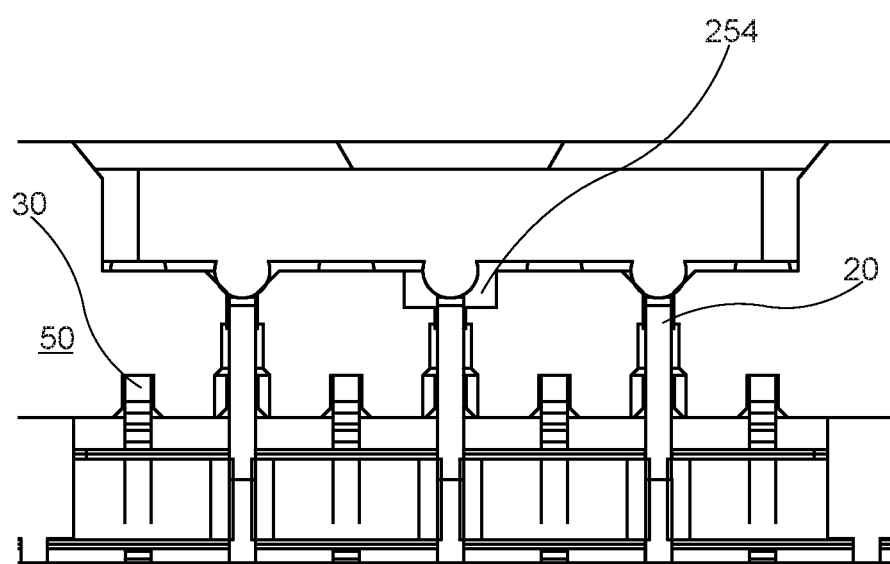
FIG. 3 illustrates a plan sectional view of FIG. 2 rotated 90 degrees (side view).

FIG. 3 illustrates a plan sectional view of FIG. 2 rotated 90 degrees (side view).

Figure 4:
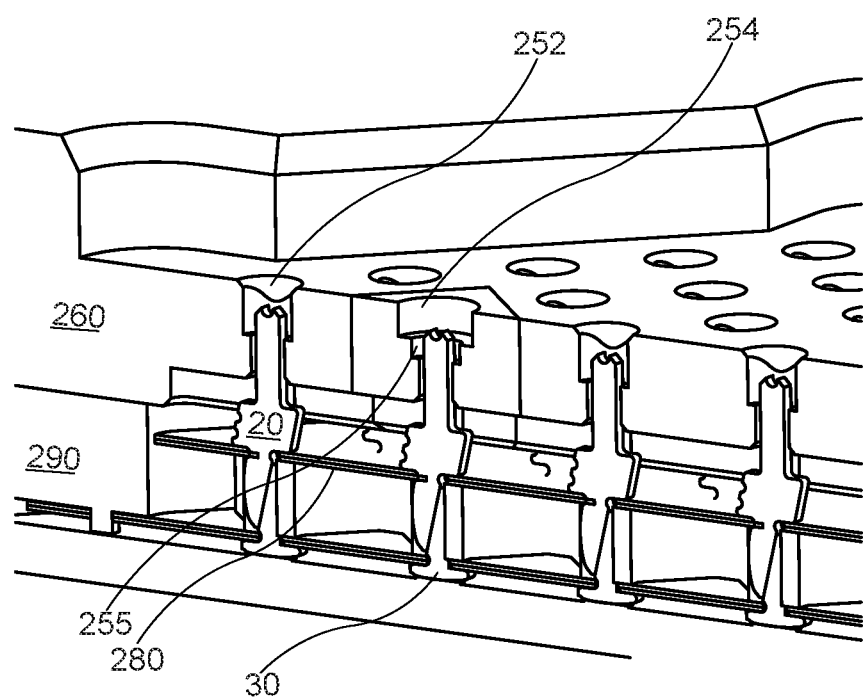
FIG. 4 illustrates a perspective view like FIG. 1 taken from above.

FIG. 4 illustrates a perspective view like FIG. 1 taken from above.

Figure 5:
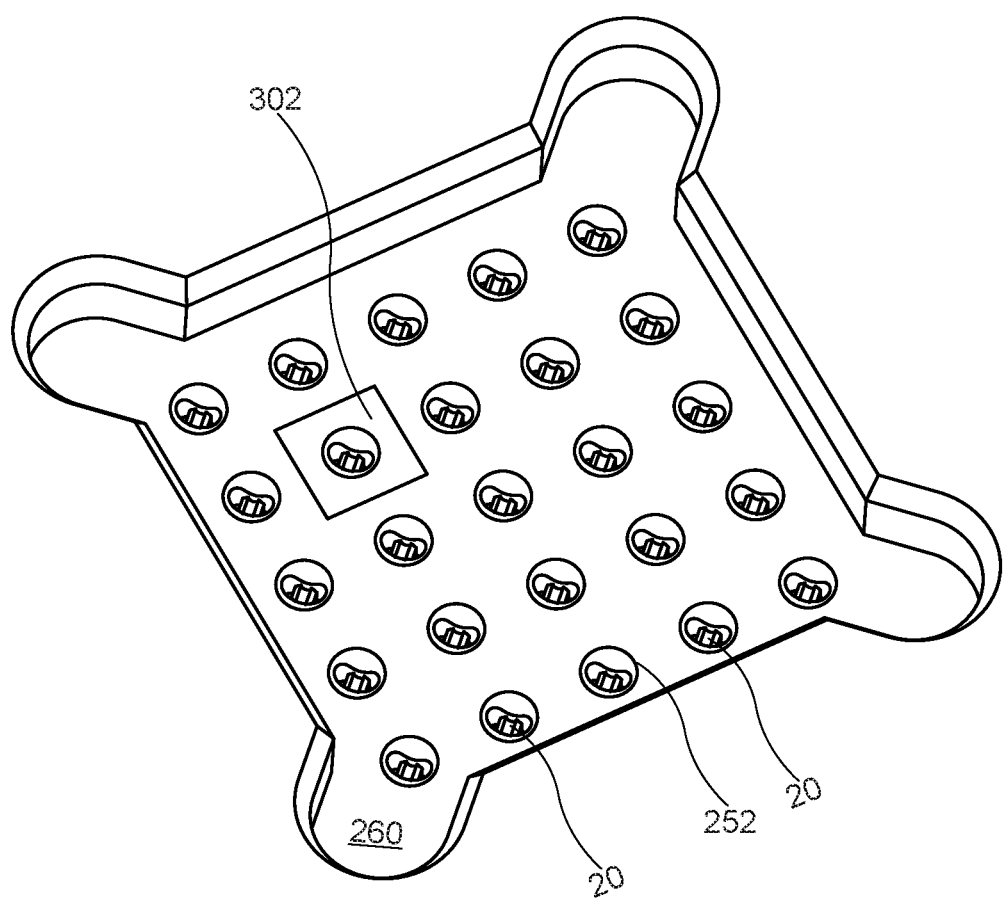
FIG. 5 illustrates is a top perspective view of plate 260 showing only chamfered/countersunk-bored recesses apertures 252.

FIG. 5 illustrates is a top perspective view of plate 260 showing only chamfered/counter-sunk-bored recesses apertures 252. In this embodiment a metal trace 302 surrounds the aperture 252. Metalizing parts of the plate can be advantageous for impedance matching and crosstalk isolation.

Figure 6:
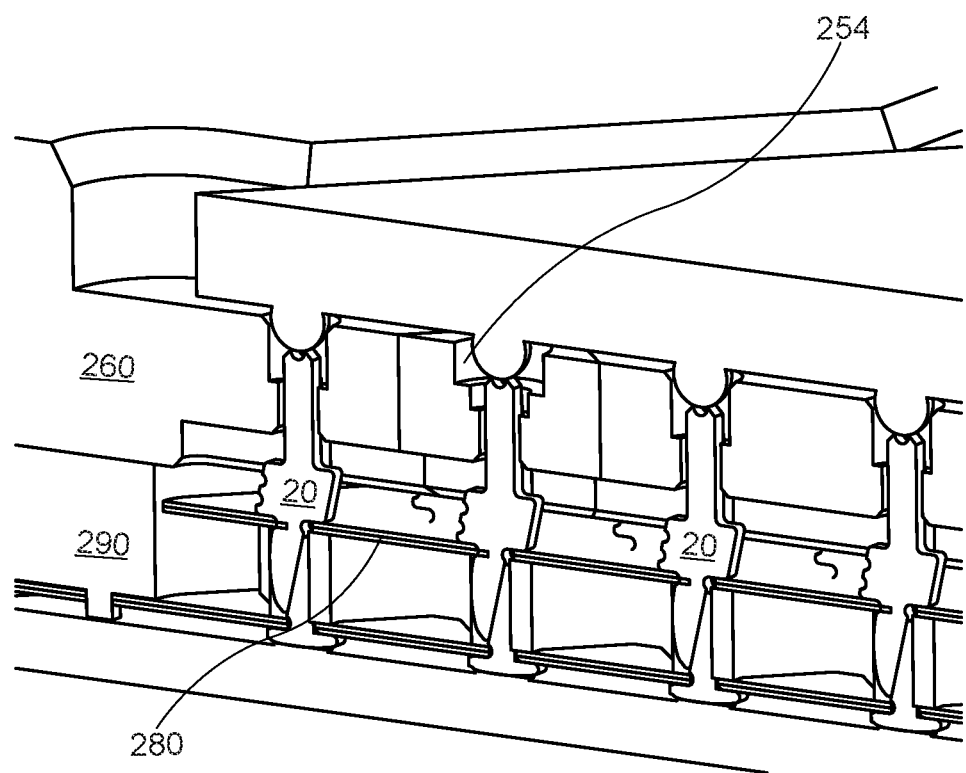
FIG. 6 illustrates a view like FIG. 1.

FIG. 6 illustrates a view like FIG. 1.

Figure 7:
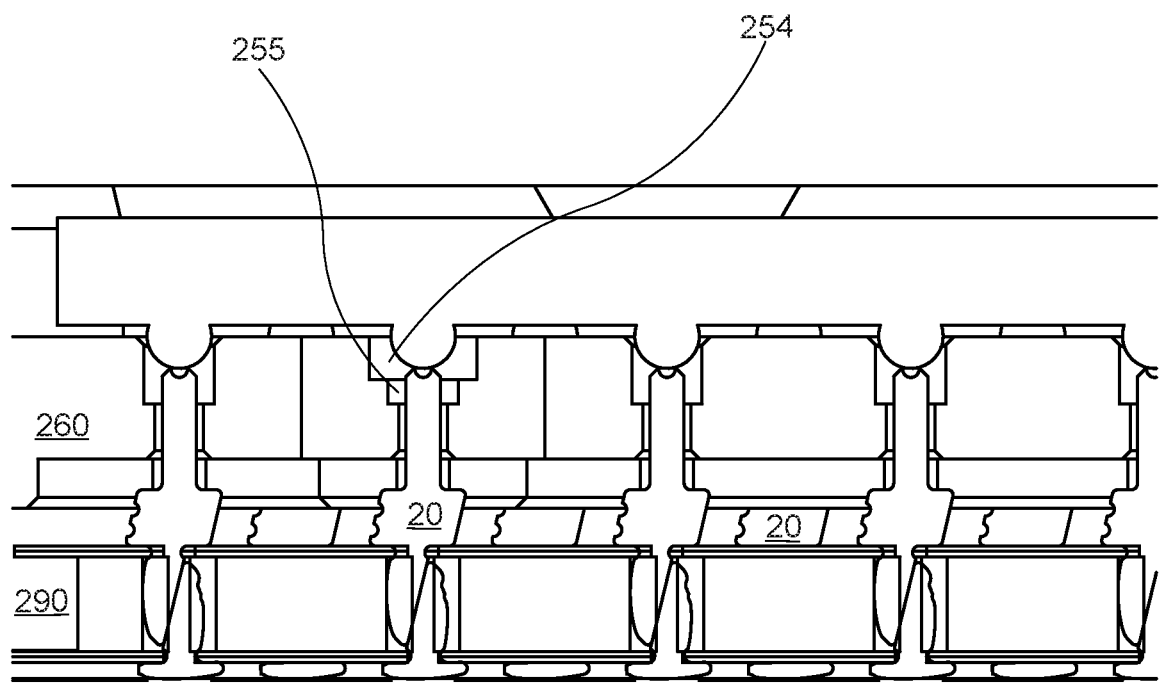
FIG. 7 illustrates a view like FIG. 2.

FIG. 7 illustrates is a view like FIG. 2.

Figure 8:
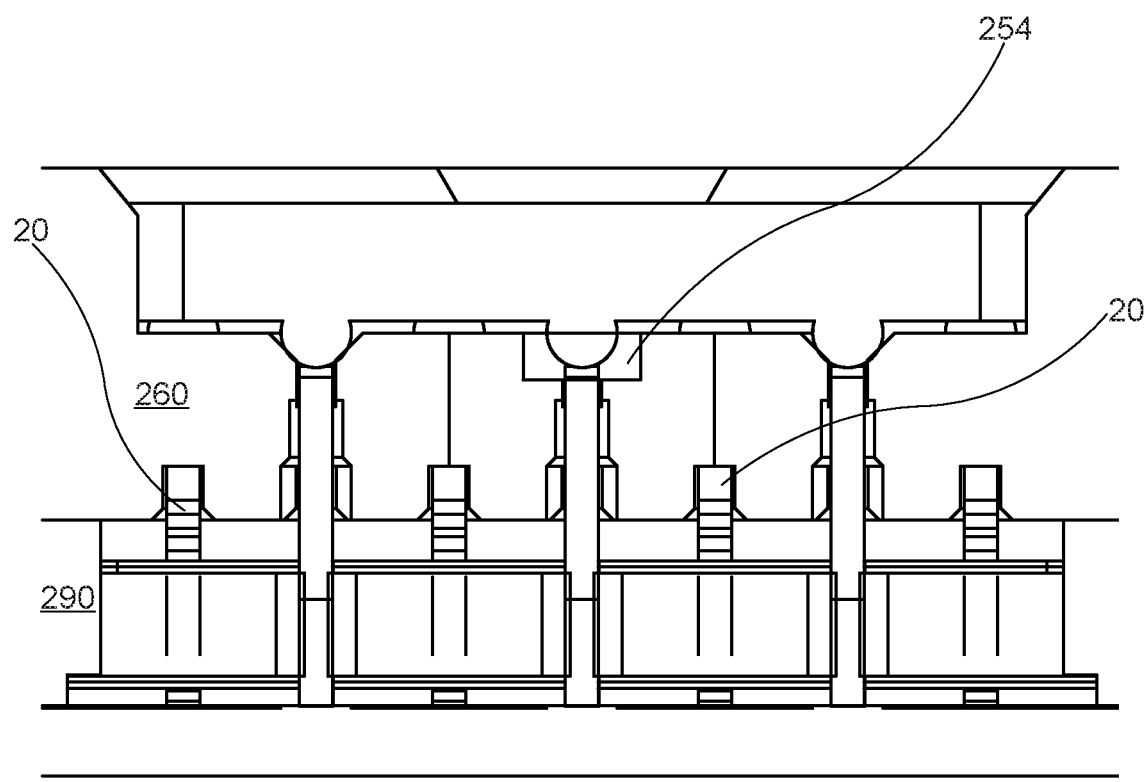
FIG. 8 illustrates a view like FIG. 3.

FIG. 8 illustrates FIG. 8 is a view like FIG. 3.

Figure 9:
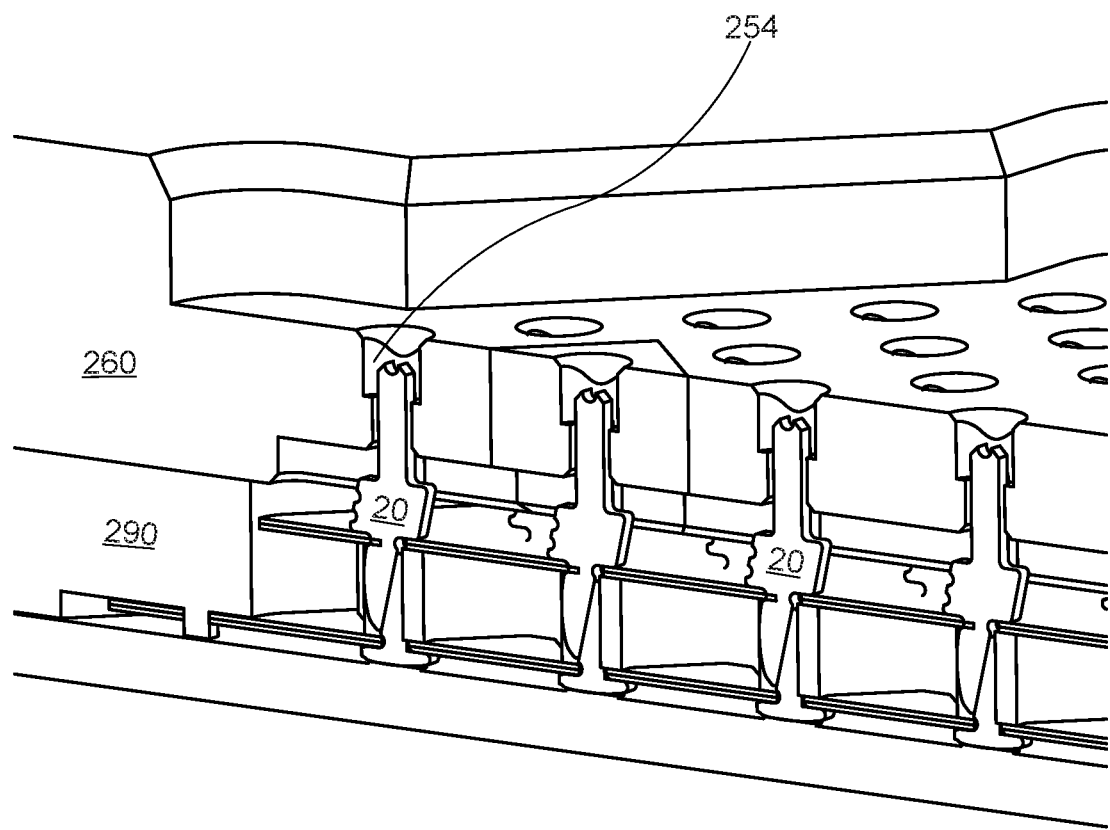
FIG. 9 illustrates a view like FIG. 4.

FIG. 9 illustrates is a view like FIG. 4.

Figure 10:
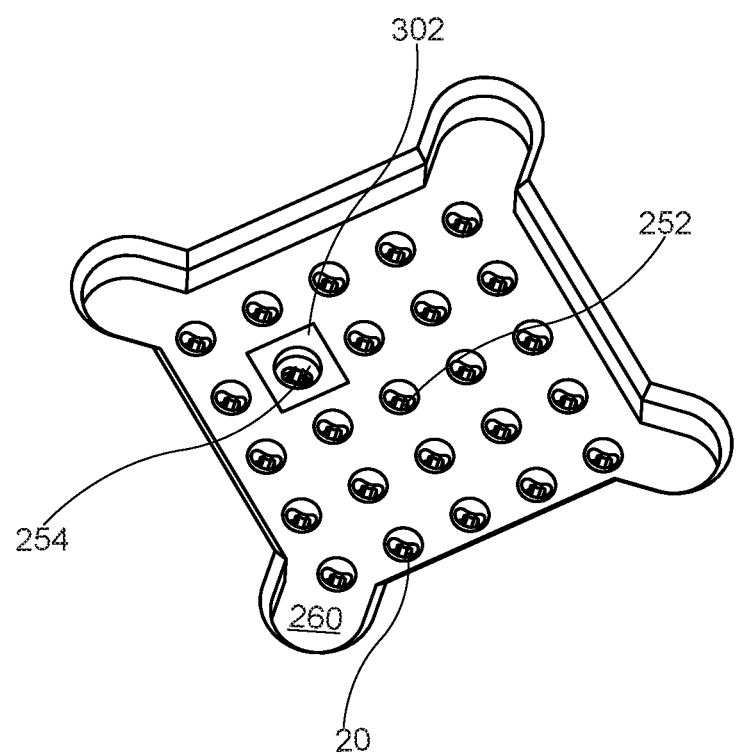
FIG. 10 illustrates a view like FIG. 5 except that one aperture is a counterbored/sunk type 254.

FIG. 10 illustrates is a view like FIG. 5 except that one aperture is a counterbored type 254. In this embodiment several bores are bounded by a metalizing layer/trace 302 which may be grounded. Note that FIG. 10 may also be provided without a metal trace 302.

Figure 11:
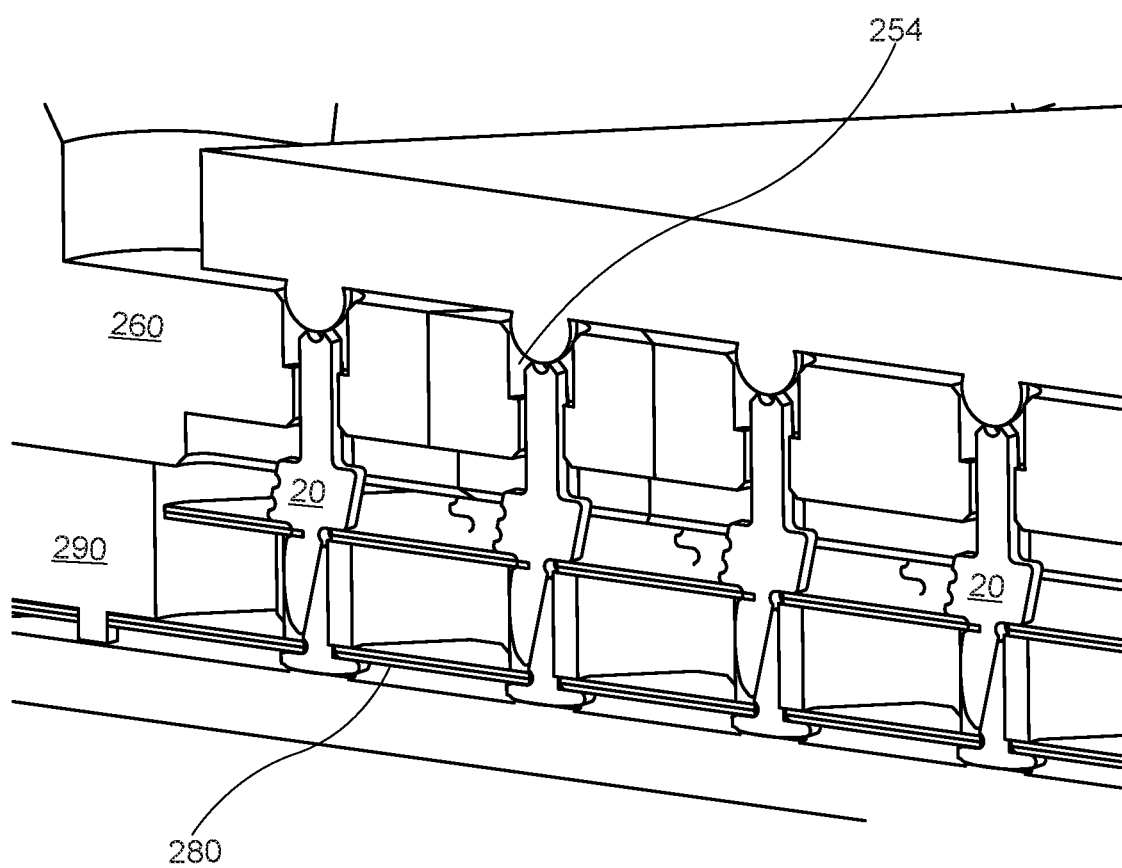
FIG. 11 illustrates a view like FIG. 1.

FIG. 11 illustrates a view like FIG. 1.

Figure 12:
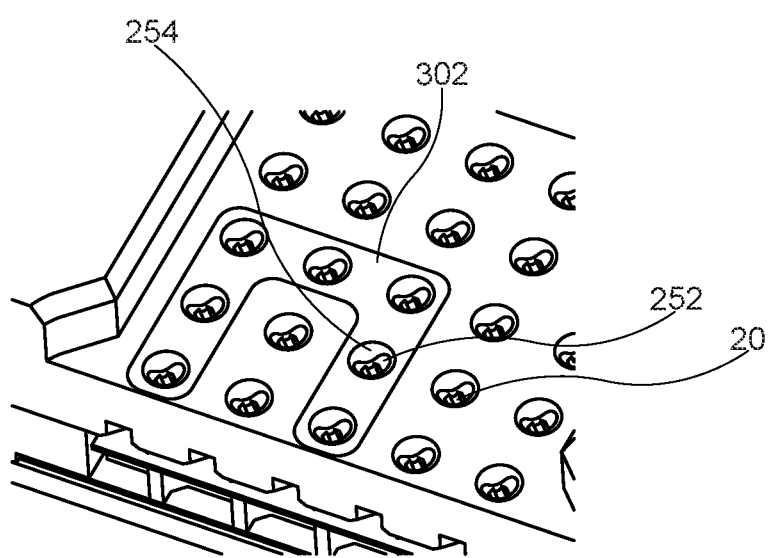
FIG. 12 illustrates a view like FIG. 5 except that a metallic trace 302 provides a ground plane for several apertures and surrounds other apertures.

FIG. 12 illustrates a view like FIG. 5 except that a metallic trace 302 provides a ground plane for several apertures and surrounds other apertures.

Figure 13:
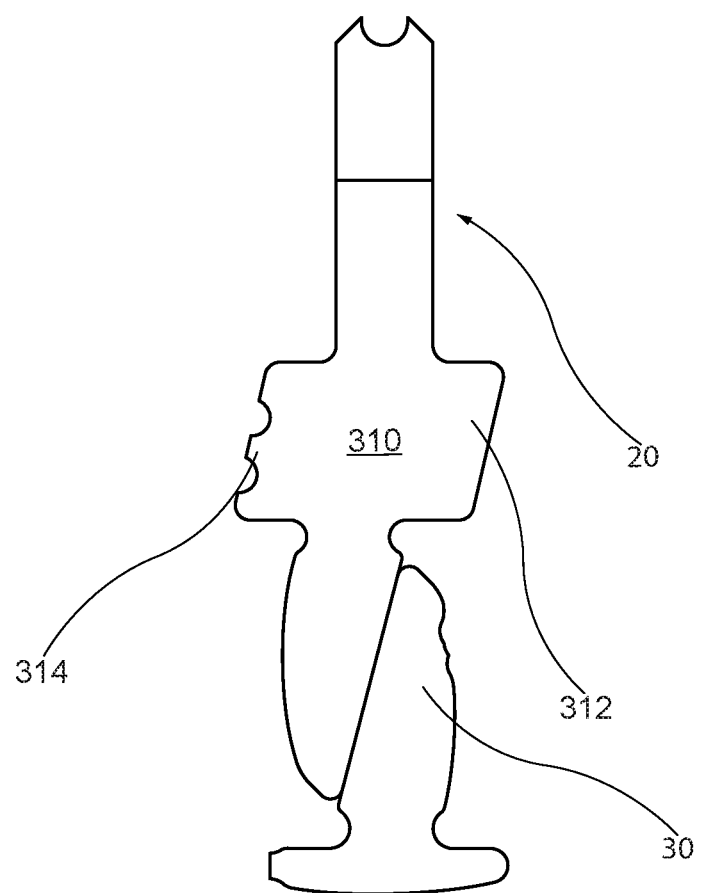
FIG. 13 illustrates a pin pair 20/30 where the upper pin 20 includes a transverse section 310 of cross bar flanges 312/314. The edges of these flanges are diagonally formed or slanted.

FIG. 13 illustrates a pin pair 20/30 where the upper pin 20 includes a transverse section 310 of cross bar flanges 312/314. The edges of these flanges are diagonally formed or slanted.

Figure 14:
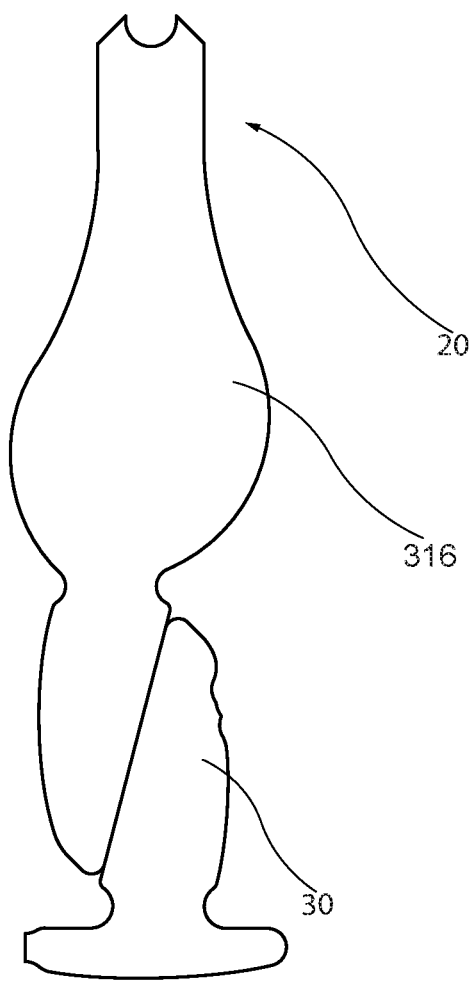
FIG. 14 illustrates a pin pair like FIG. 13 except that cross bar flanges are replaced by a bulbous portion 316.

FIG. 14 illustrates a pin pair like FIG. 13 except that cross bar flanges are replaced by a bulbous portion 316. Bulbous portion 316 is located between the tip end and the sliding surface end of the upper pin (though the same bulbous structure can be applied to the lower pin). The bulbous portion is an expanded part of the pin body between the ends and has an arcuate shape on one or both of its sidewalls. The arcuate shape may be mirror image or dissimilar in shape. From the bulbous portion to the tip a sloping taper is preferable.

Figure 15:
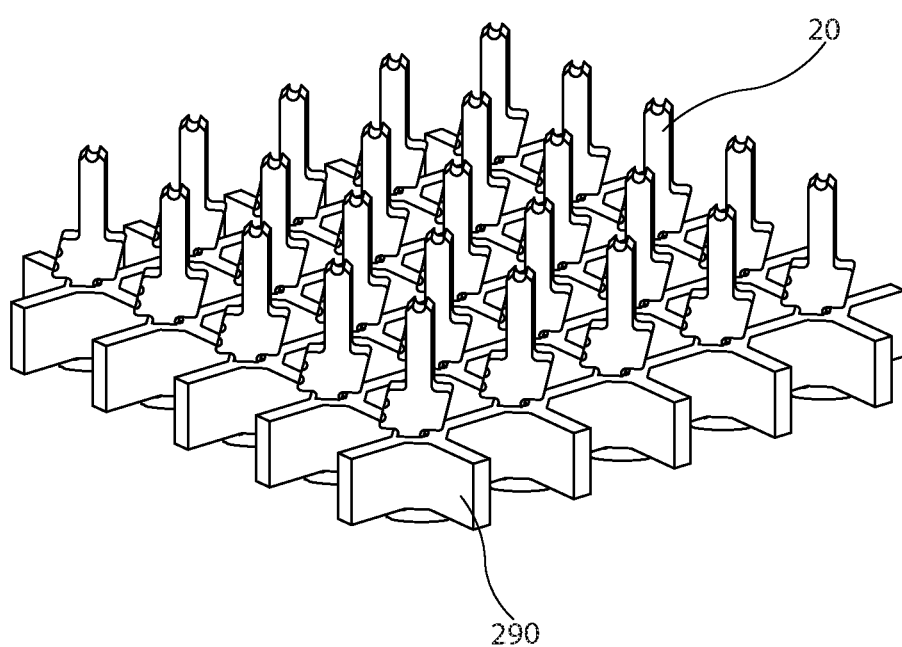
FIG. 15 illustrates a perspective view of a pin array with top layers 260, 270 and 280 removed showing the elastomeric layer/matrix 290.

FIG. 15 illustrates a perspective view of a pin array with top layers 260, 270 and 280 removed showing the elastomeric layer/matrix 290 which is formed of a pattern of larger spaced and smaller apertures for receiving pins 20. The open spaces allow for the deflection of the elastomer without substantially raising the load/bias force on the pin pairs as they slide by each other and deflect the elastomer.

Figure 16:
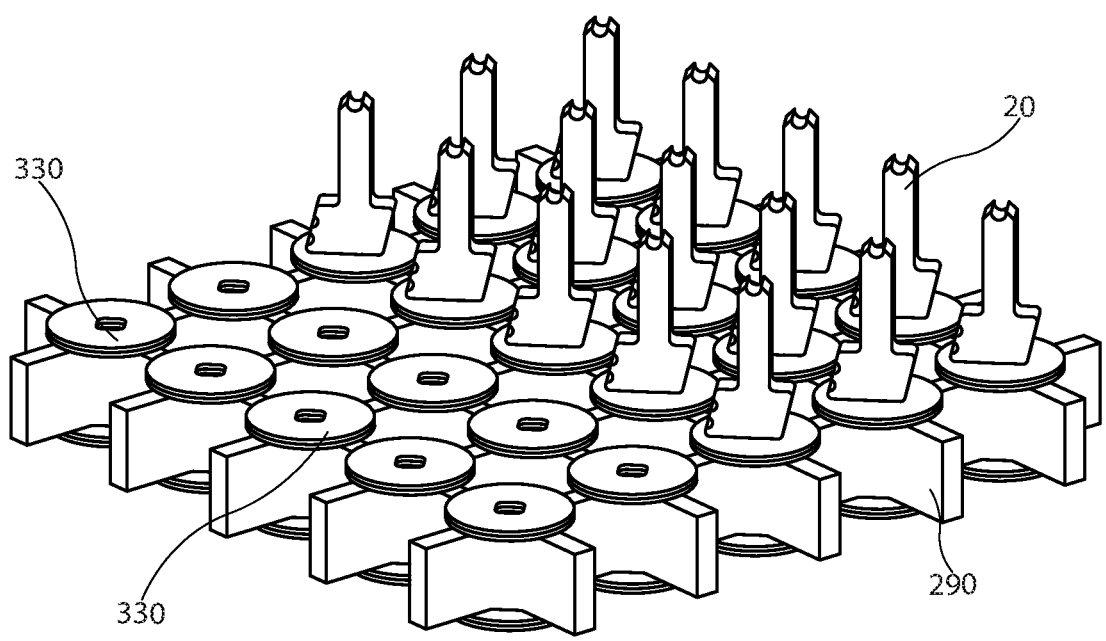
FIG. 16 illustrates a view like FIG. 15 except the downstop/anti intrusion layer is formed of individual disks 330 which sit atop the elastomer 290.

FIG. 16 illustrates a view like FIG. 15 except the down-stop anti-intrusion layer is formed of individual disks 330 which sit atop the elastomer 290. The disks preferably have sufficient diameter to extend at least beyond a portion or all of the flanges 310. By having separate/singulated disks instead of a single anti-intrusion plate, each pin is able to respond independently to deflection by the BGA.

Figure 17:
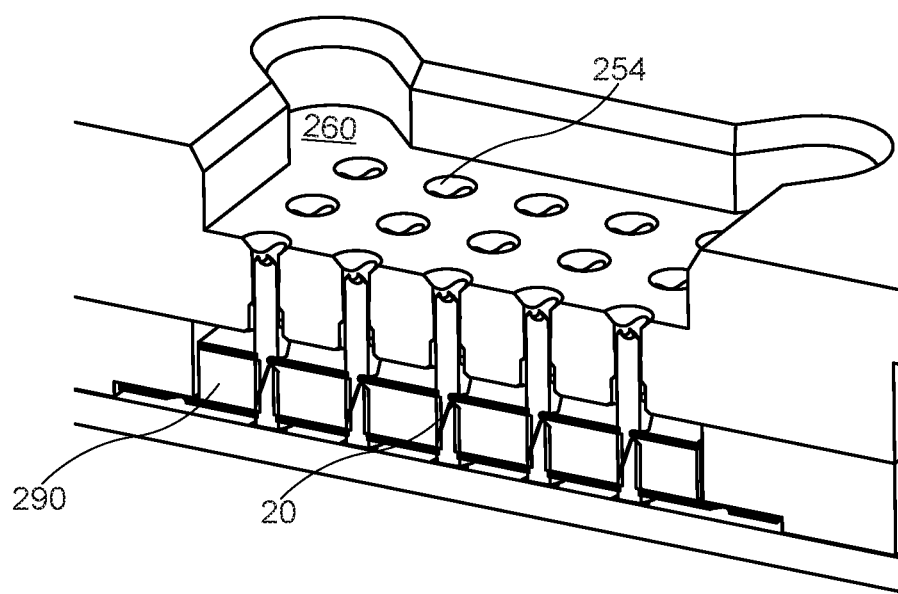
FIG. 17 illustrates a sectional view of the subject matter of FIG. 1 with the device under test (DUT) removed.

FIG. 17 illustrates a sectional view of the subject matter of FIG. 1 with the device under test (DUT) removed.

Figure 18:
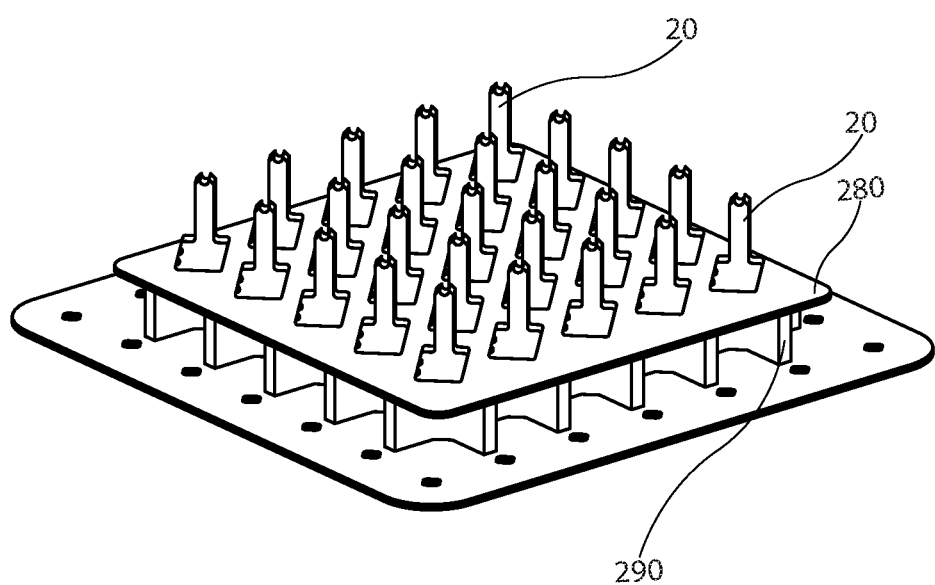
FIG. 18 illustrates a view like FIG. 15 except that layer 280 has not been removed.

FIG. 18 illustrates a view like FIG. 15 except that layer 280 has not been removed.

Figure 19:
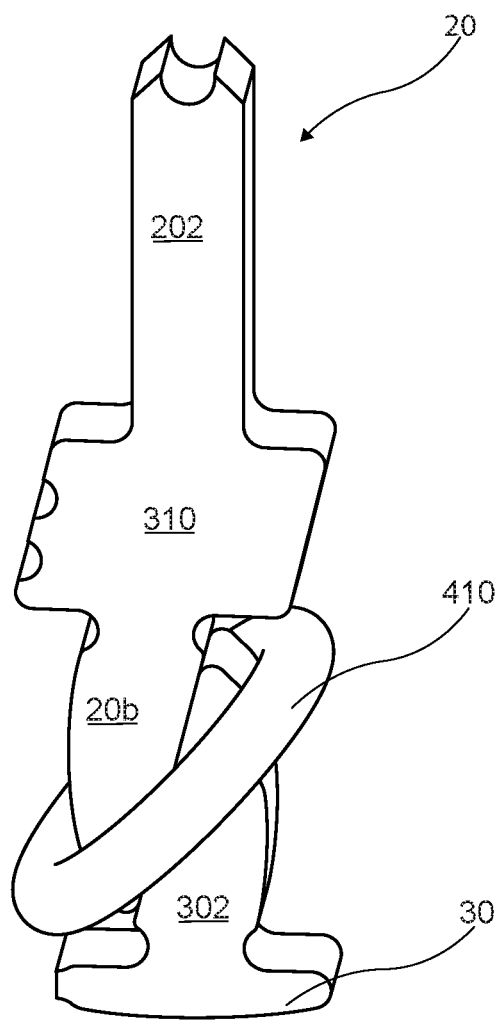
FIG. 19 illustrates a perspective view of an alternative embodiment to FIG. 15.

FIG. 19 illustrates a perspective view of an alternative embodiment to FIG. 15 where the pin pairs 20/30 are maintained biased together by an elastomeric tubular ring 410 which preferably snuggly surrounds the lower portion 20b of pin 20 and the lower upper portion 30a if pin 30 in slidable relationship. This ring/band 410 is preferably tubular but may also be a flat band. It may replace elastomer 290 or be used on some pins while others use the elastomer 290. It may also be used to supplement elastomer 290 for pins that require a higher bias force to maintain an adequate low impedance connection. The ring or band is an elastomeric material which engaged the lower distal part 20b of the upper pin and any part of the lower pin and binds them together but in a slideably relationship. The ring may also be a band which is flat or non-tubular.

Figure 20:
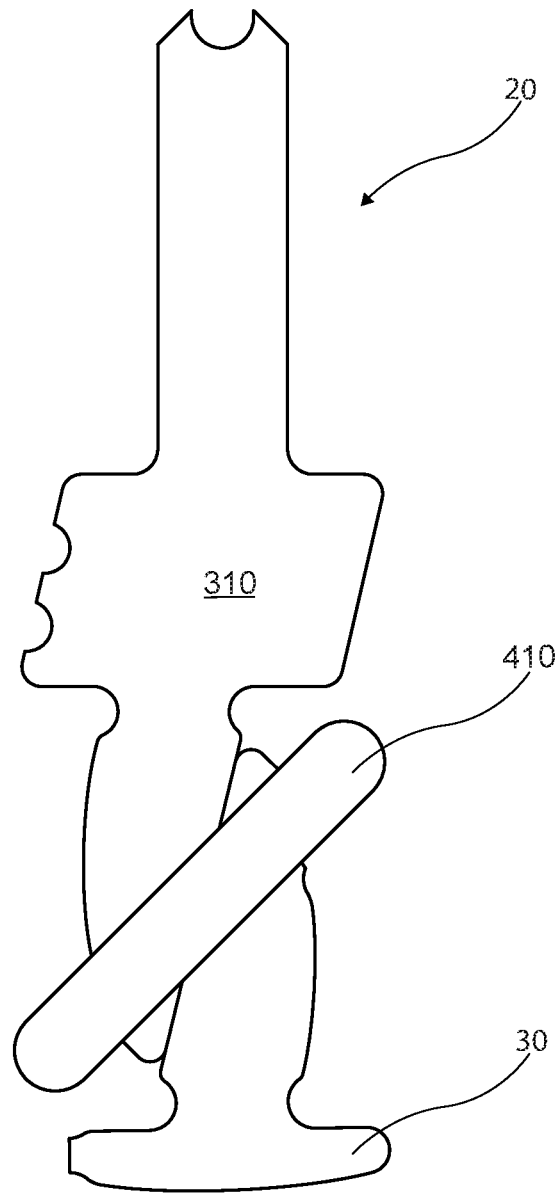
FIG. 20 illustrates a side plan view of FIG. 19.

FIG. 20 illustrates a side plan view of FIG. 19.

Figure 21:
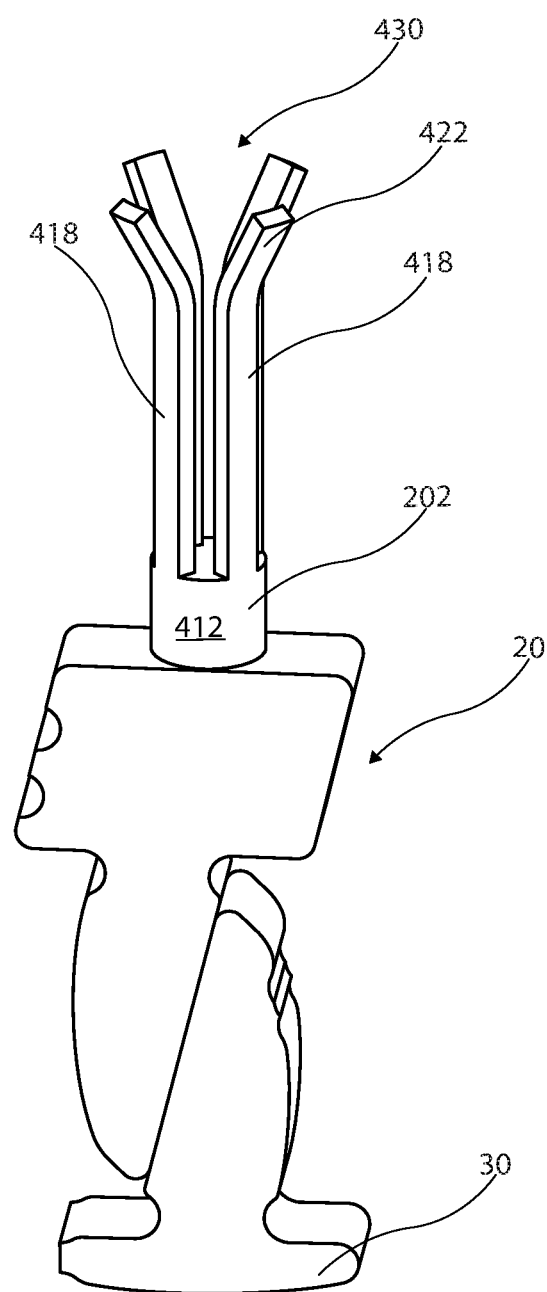
FIG. 21 illustrates a perspective view of an alternative embodiment to FIG. 16.

FIG. 21 illustrates a perspective view of an alternative embodiment to FIG. 16 where the upper portion pin 20a is formed of a cylindrical "basket" section 412 and a plurality of vertical tines 418, each terminating at its distal end in a outwardly splayed/deflected portion 422 thereby forming a basket 430 for ball 2 (shown in FIG. 1) of the DUT. The tines may be lateral deflectable on to absorb impact forces of the DUT ball when placed in the test socket by a robotic handler. It can also compensate misalignment of the balls 2 on the DUT due do manufacturing tolerances. The tines are joined at a base 202 by a concentric ring 412

Figure 22:
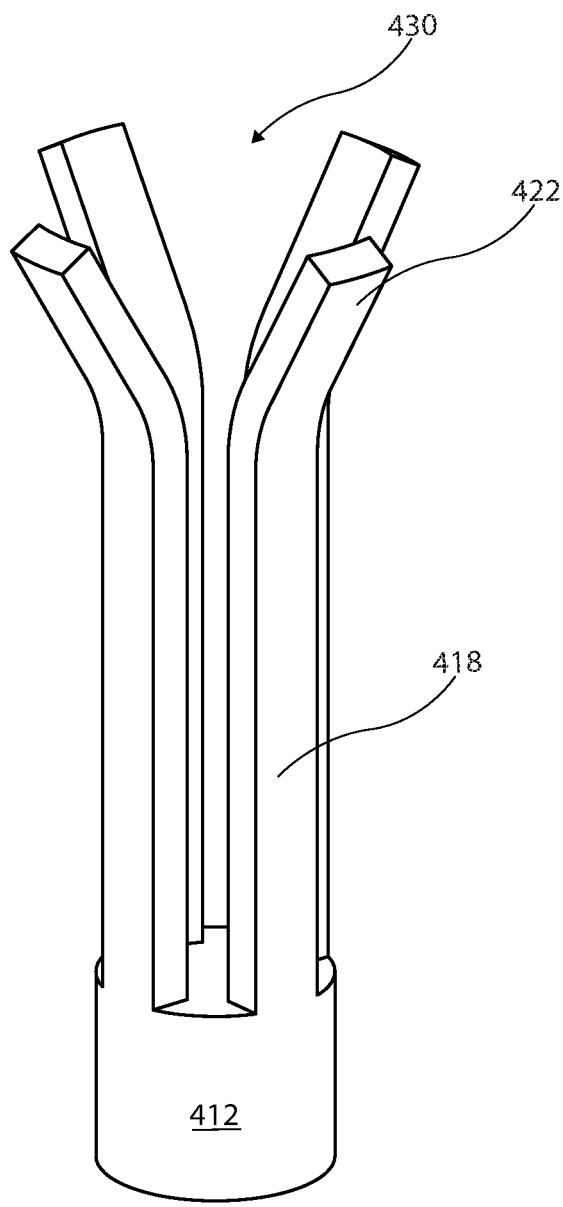
FIG. 22 illustrates a close up view of a portion of FIG. 21.

FIG. 22 illustrates a close up view of a portion of FIG. 21.

Figure 23:
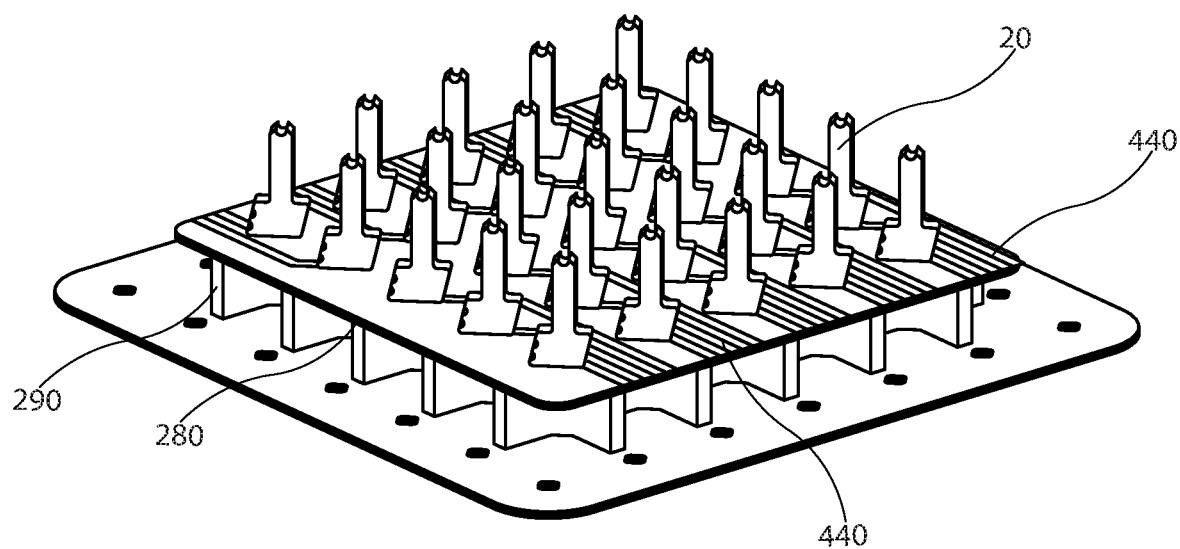
FIG. 23 illustrates a view like FIG. 18 except including electrical traces 440 which provide, for example grounding connections to the downstop plate 290.

FIG. 23 illustrates a view like FIG. 18 except including electrical traces 440 which provide, for example grounding connections to the downstop plate 290. Some apertures may need ground isolation and thus will be plated around (see FIG. 12). This figure illustrates how a plurality of traces can connect plating 302 to a common ground.

Figure 24:
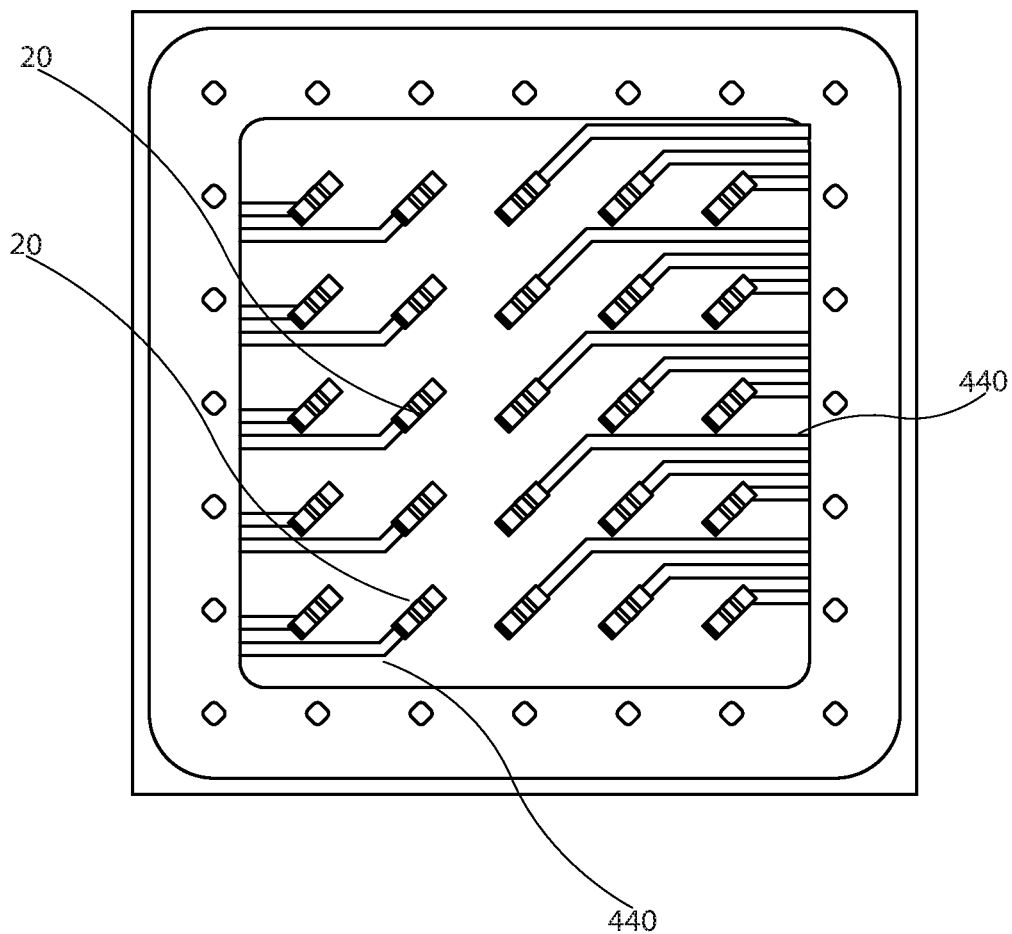
FIG. 24 illustrates a top view of FIG. 23.

FIG. 24 illustrates a top view of FIG. 23.

Figure 25:
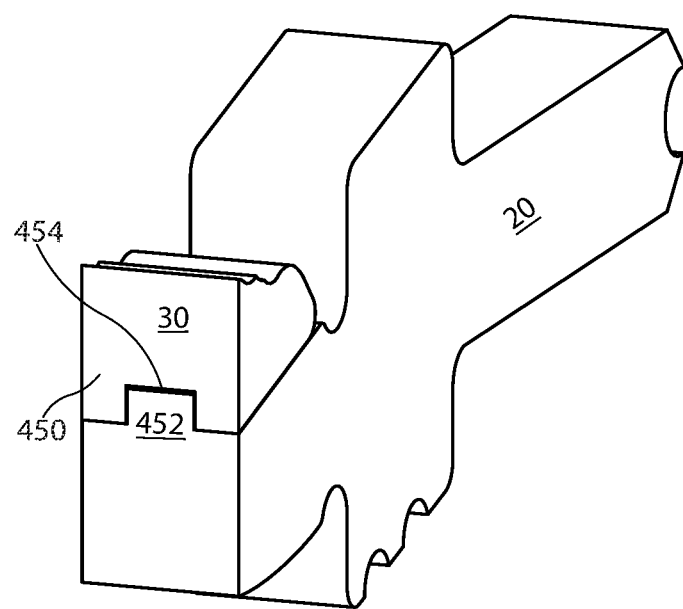
FIG. 25 illustrates a bottom perspective view of an alternate embodiment of a pin pair.

FIG. 25 illustrates a bottom perspective view of an alternate embodiment of a pin pair which has a sliding interlocking joint, which includes an engagement notch 450, where one pin includes a land 452 and the other pin includes a recess 454 sized to receive the land. The land and the recess can be on either pin other than shown in the figure. This embodiment uses pin pairs 20/30 as in prior embodiments but provides an additional or alternate way of insuring constant electrical contact between the pairs yet provide for a slidable relationship therebetween.

Figure 26:
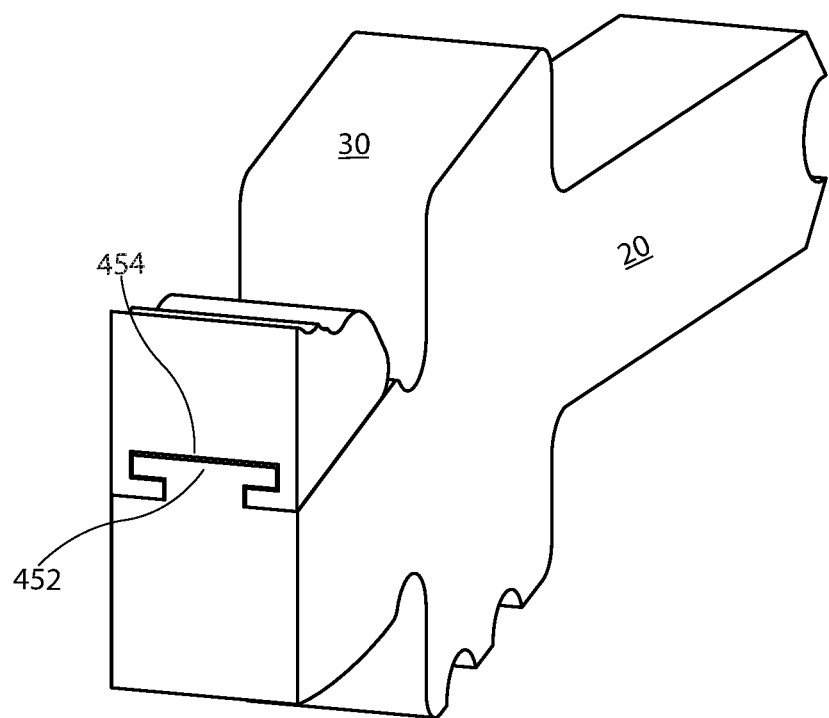
FIG. 26 illustrates a tongue and grove version of FIG. 25.

FIG. 26 illustrates a tongue and groove version of FIG. 25 where the land includes side extensions spaced from its base and the recess is like sized to allow sliding but the pins cannot accidentally separate. A dovetail cut or other captured relationship is possible, such as a ball and socket, etc. In short, the pins maintained in contact at all times and the surface area of contact is substantially increased by the interlocking structure. This also insures alignment between the two pins. The tongue/groove or other interlocking structure can be reversed from what is shown so that either pin may have the projection and the other have the grove. FIG. 26 shows an elevated tongue 452 and a recessed groove 454 with the tongue partially encapsulated within the groove.

Figure 27:
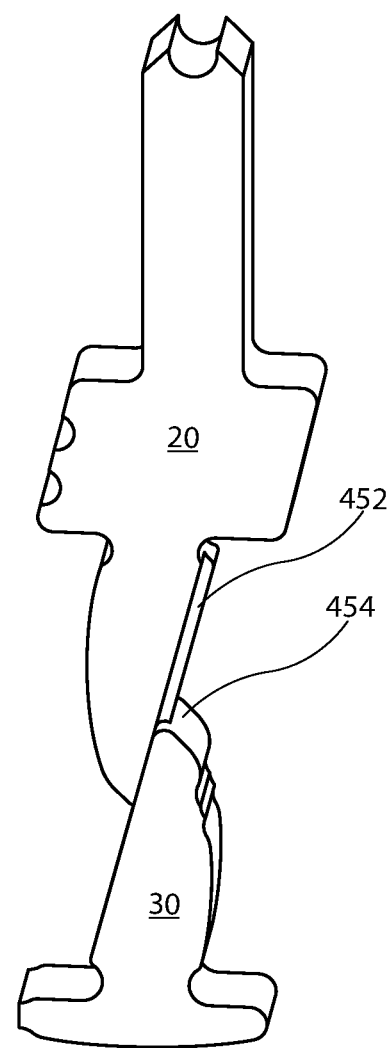
FIG. 27 illustrates side perspective view of FIGS. 25 and 26.

FIG. 27 illustrates a side perspective view of FIGS. 25 and 26 with a V-shaped groove.

Figure 28:
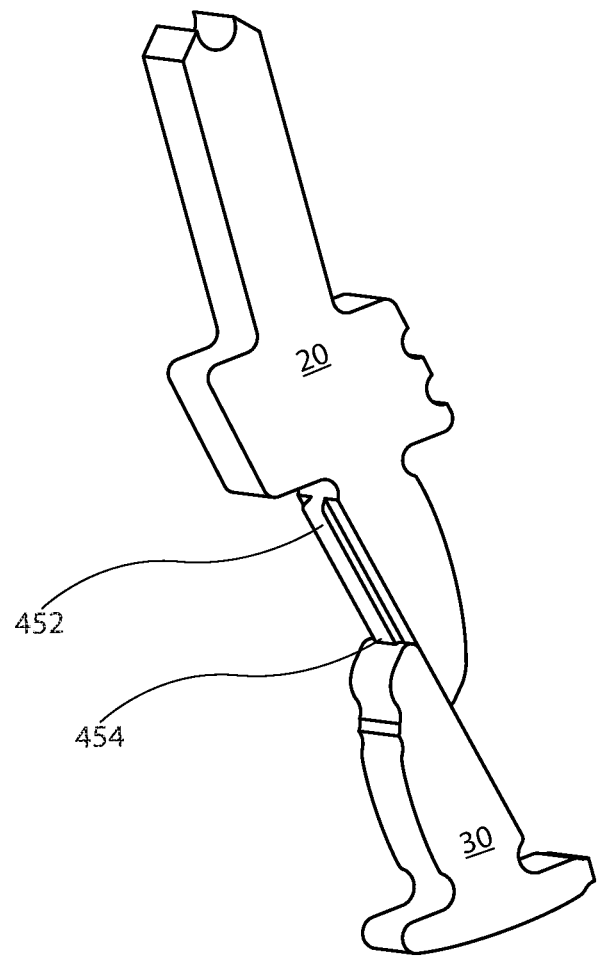
FIG. 28 illustrates a side perspective view of FIG. 25.

FIG. 28 illustrates a side perspective view of FIG. 25.

Figure 29:
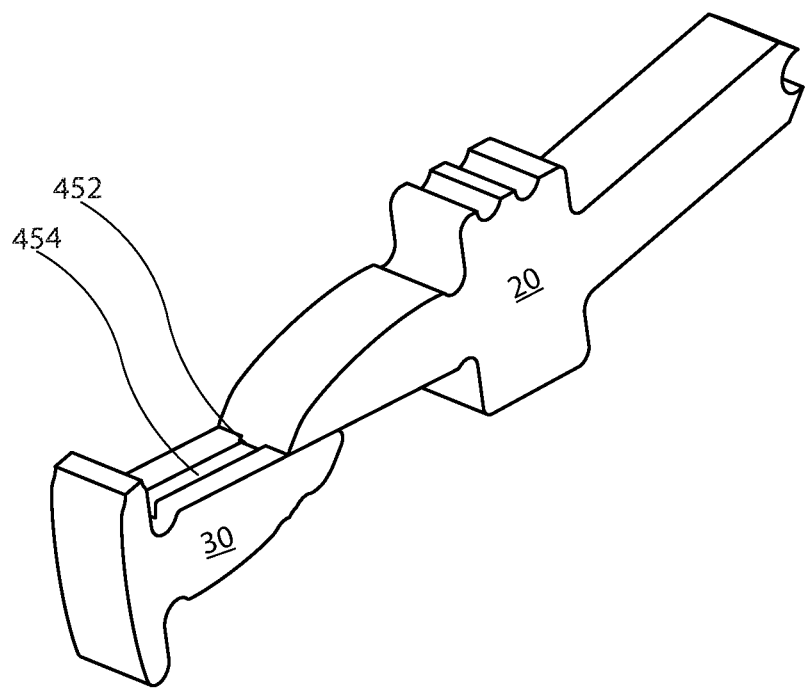
FIG. 29 illustrates another side perspective view of FIG. 25.

FIG. 29 illustrates another side perspective view of FIG. 25.

Figure 30:
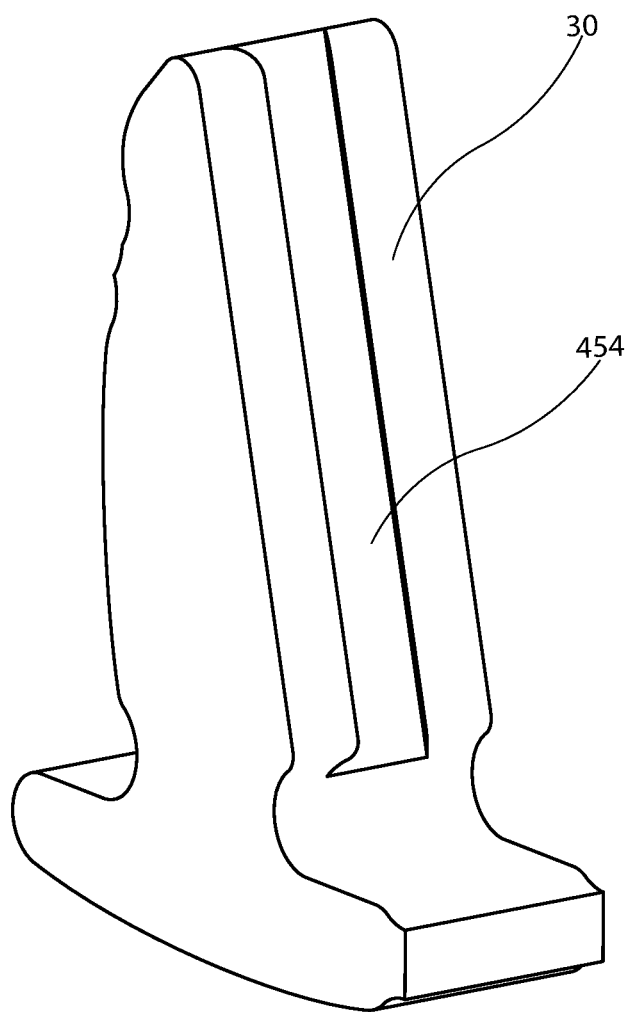
FIG. 30 illustrates a perspective view of pin 29 of FIG. 25.

FIG. 30 illustrates a perspective view of pin 29 of FIG. 25.

Figure 31:
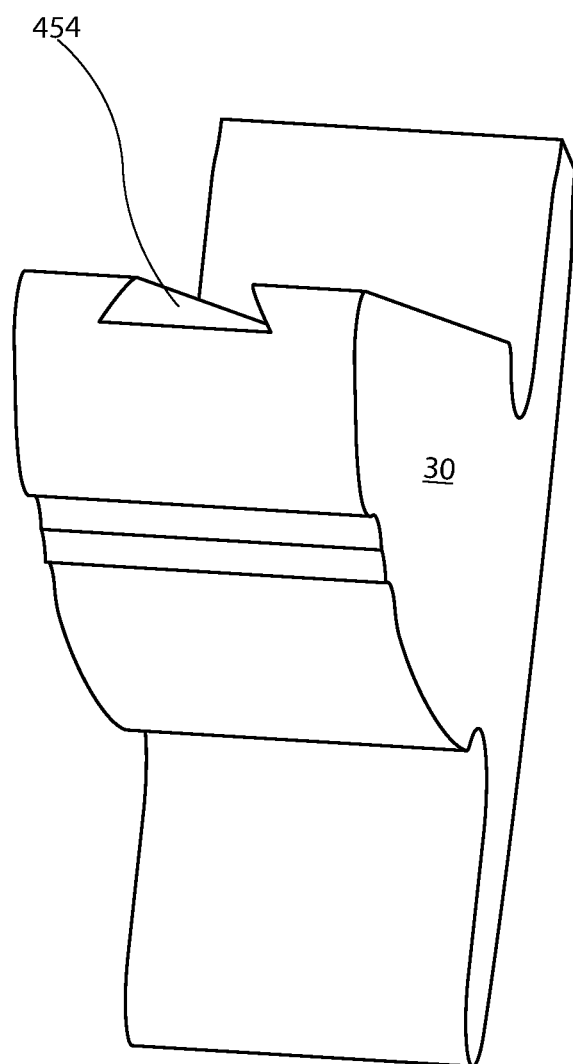
FIG. 31 illustrates a perspective view of pin 29 with a tongue and groove style recess 454.

FIG. 31 illustrates a perspective view of pin 29 with a tongue and groove style recess 454.

Figure 32:
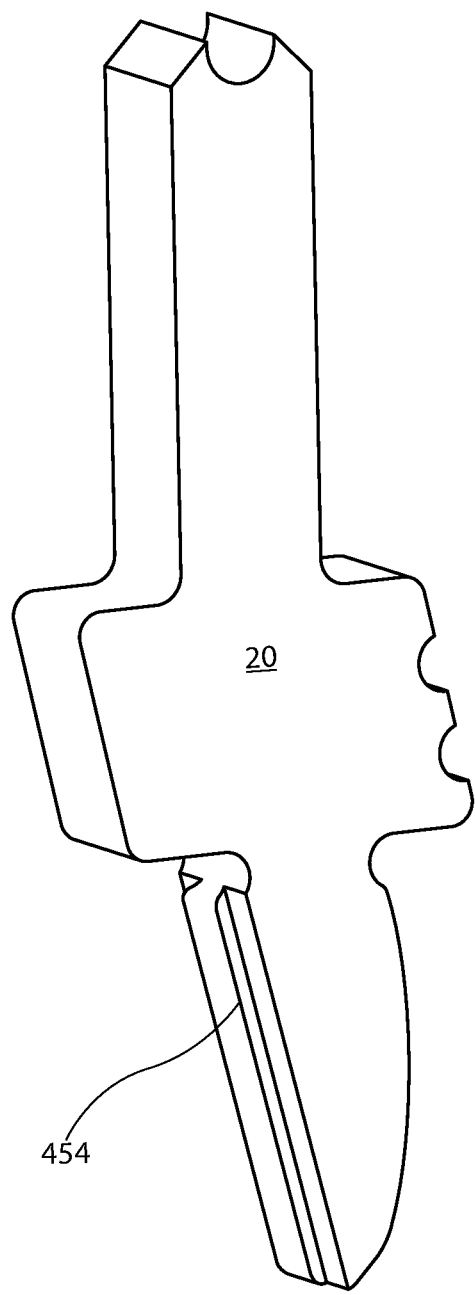
FIG. 32 illustrates a perspective view of pin 20 which mates with pin 30 of FIG. 31.

FIG. 32 illustrates a perspective view of pin 20 which mates with pin 30 of FIG. 31.

Figure 33:
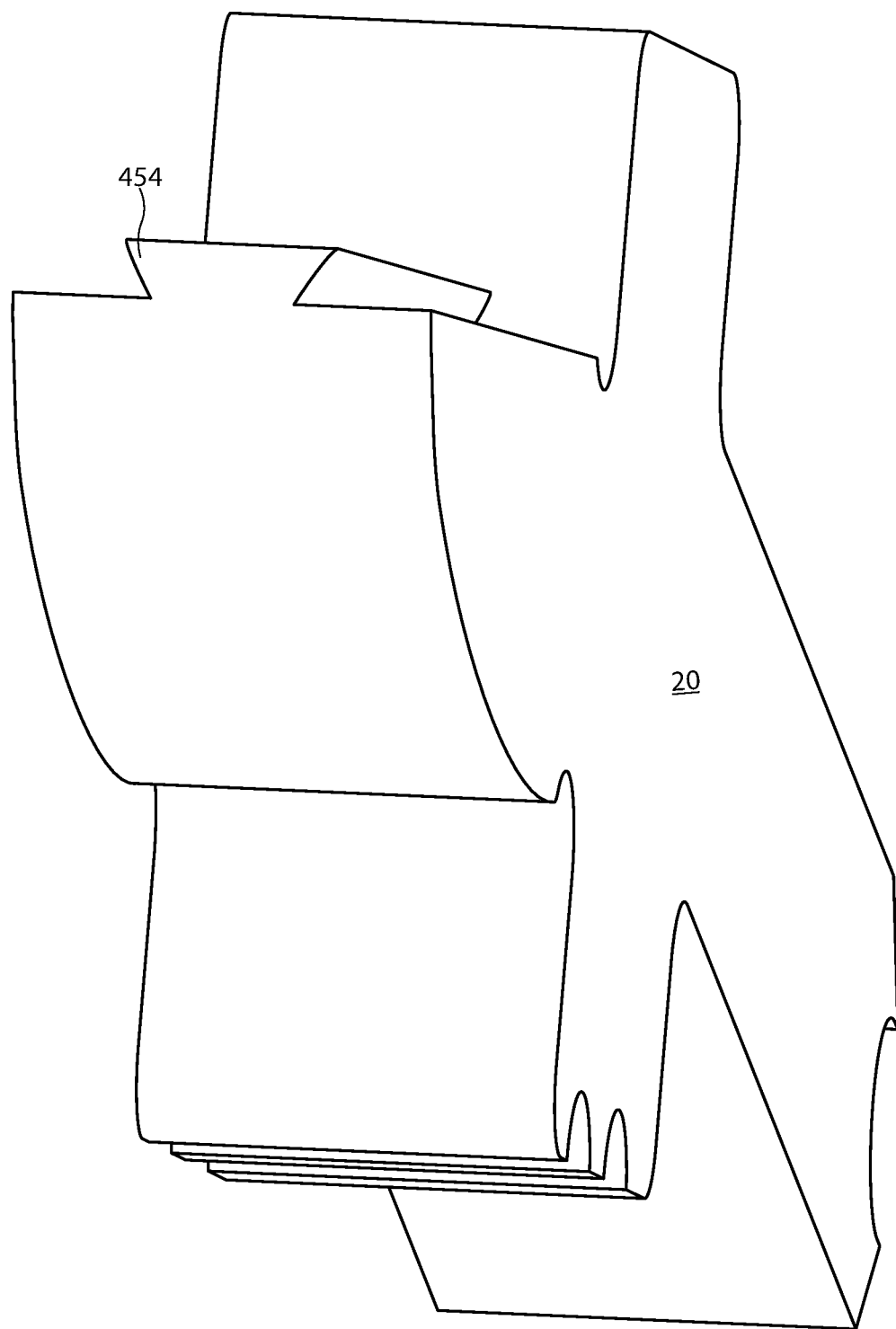
FIG. 33 illustrates an end perspective view of FIG. 32.

FIG. 33 illustrates an end perspective view of FIG. 32.

Figure 34:
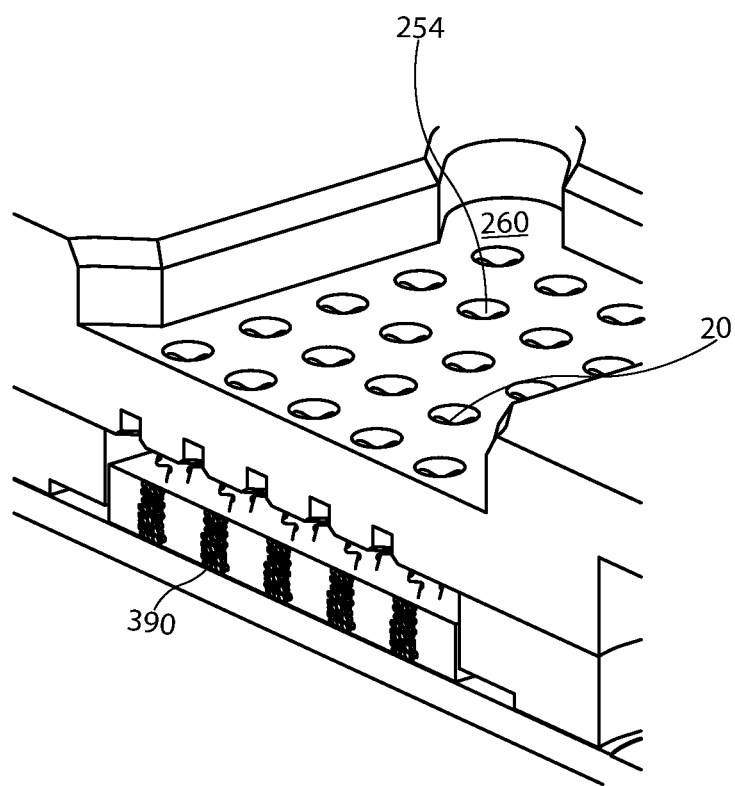
FIG. 34 illustrates an alternative embodiment where the elastomer matrix 290 is replaced by a plurality of spherical elastomeric balls 390.

FIG. 34 illustrates an alternative embodiment where the elastomer matrix 290 is replaced by a plurality of spherical elastomeric balls 390 and the pin pairs are surrounded by the balls, either in cavities or completely filling the space between pin pairs, to provide the bias force to maintain the pins in slidable contact. The balls are small spheres which are compressible which fill the available spaced so that the pin pairs are maintained in contact. The balls can also be conductive or non-conductive. It would be preferable to make the walls confining the spheres rigid or semi-rigid to apply sufficient force into the spheres.

Figure 35:
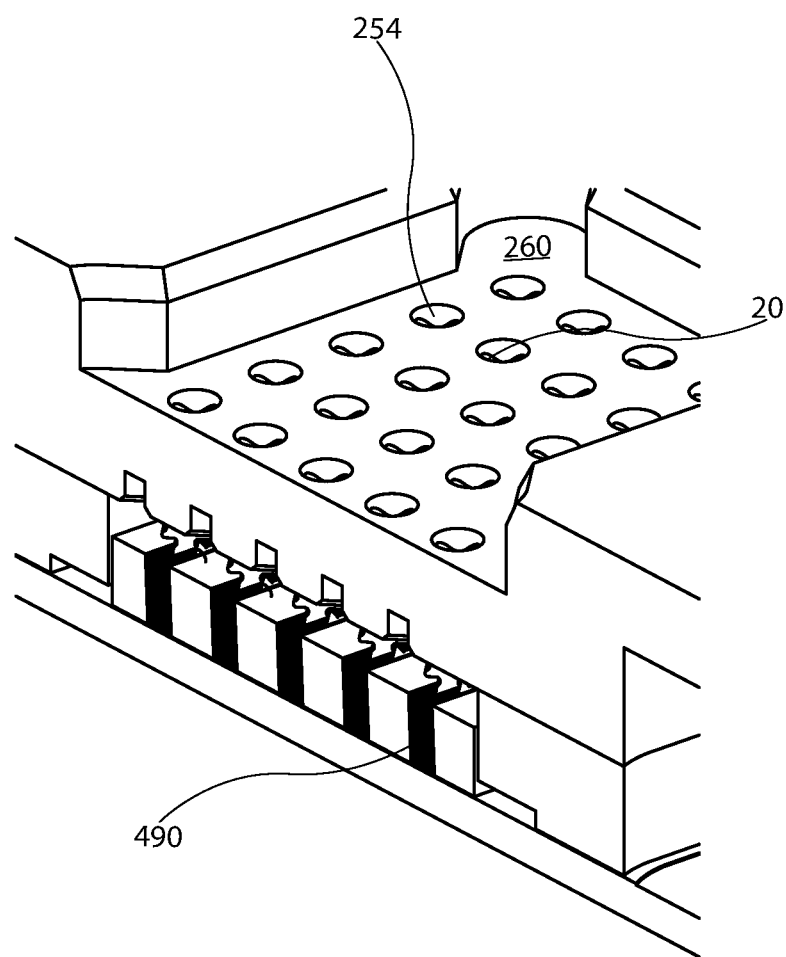
FIG. 35 illustrates an alternative embodiment where the elastomer matrix 290 is replaced by a plurality of elastomeric sheets 490.

FIG. 35 illustrates an alternative embodiment where the elastomer matrix 290 is replaced by a plurality of elastomeric planar sheets 490 stacked on each other, such as vertically or horizontally and the pin pairs are surrounded by the sheets, either in cavities or completely filling the space between pin pairs, to provide the bias force to maintain the pins in slidable contact.

Figure 36:
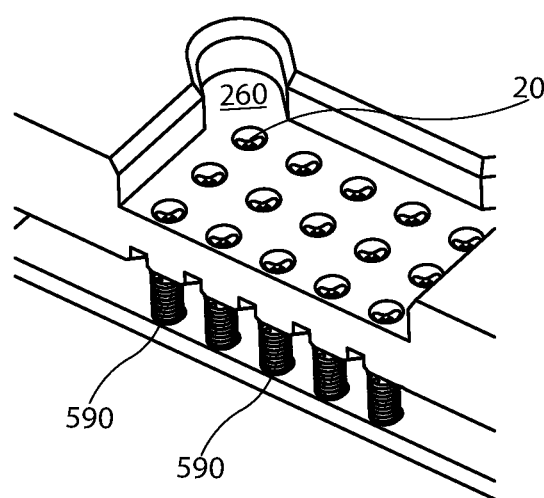
FIG. 36 illustrates an alternative embodiment where the elastomer matrix 290 is replaced by plurality springs 590.

FIG. 36 illustrates an alternative embodiment where the elastomer matrix 290 is replaced by a plurality springs 590 which engage the pin pairs to provide the bias force to maintain the pins in slidable contact but also provide an upward bias force on pins 20. The inner diameter of the springs is small enough to maintain the pins in a slidable mated stated to each other. The spring can have multiple diameters to fit the varying cross section of the pin pairs with the top and bottom portions being small diameter and the middle being largest. The two springs for each pin pair can be used, one for the top and bottom and the middle not having a spring.

Figure 37:
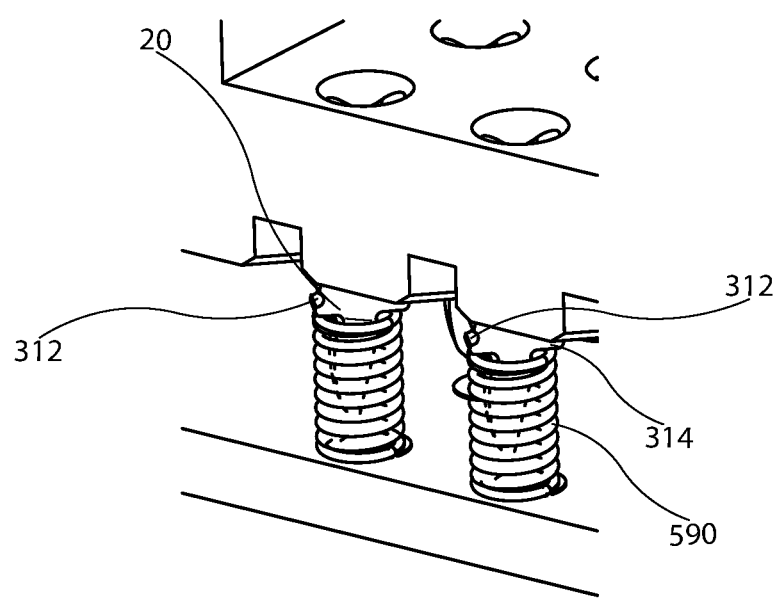
FIG. 37 illustrates a close up perspective view of FIG. 36 showing the springs.

FIG. 37 illustrates a close up perspective view of FIG. 36 showing the springs engage a shoulder of cross member 312/314 to maintain bias force.

Figure 38:
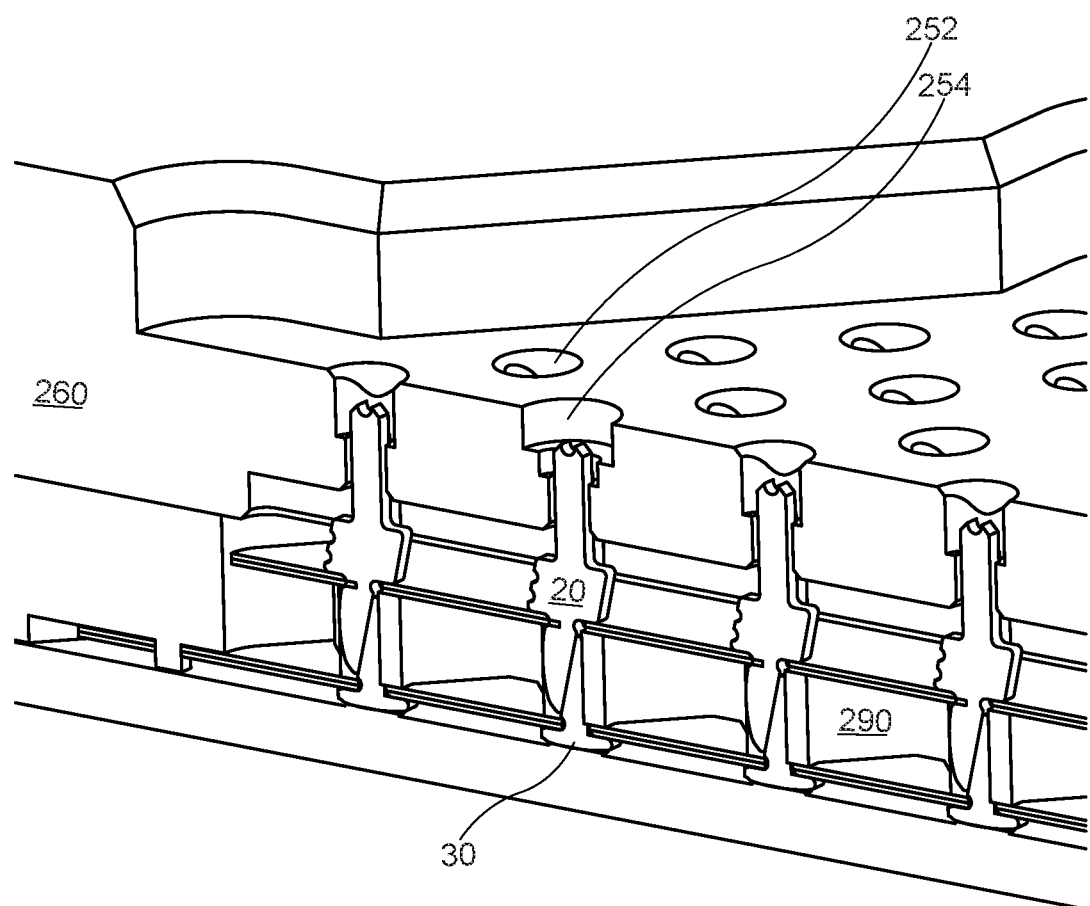
FIG. 38 illustrates a view like FIG. 4.

FIG. 38 illustrates a view like FIG. 4.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

What is claimed is:

1. A test socket for testing integrated circuit devices under test (DUT) having ball contact comprising:
   a. a housing;
   b. longitudinally compressible unit, within the housing, which forms a plurality of temporary mechanical and electrical connections for use between a device under test having a plurality of terminals and a load board having a plurality of contact pads, each contact pad being laterally arranged to correspond to said terminals;
   c. protective ball guide having a top surface, a plurality of apertures for contact pins, said apertures in said top surface, at least one of said apertures including recesses sized to receive at least part said DUT ball contact but small enough to prevent the entire ball contact from passing therethrough; said recesses including a concave portion having arcuate sidewalls;
   d. an elastomeric bias element resiliently supporting said ball guide;
   e. a longitudinally resilient, electrically insulating interposer between the top and bottom contact plates; said interposer including a resilient grid matrix of interconnected cells formed of an elastomeric material, each cell including longitudinal holes therethrough;
   f. a plurality of longitudinally compressible, electrically conductive pin pairs extending through longitudinal holes in the top contact plate, the interposer and the bottom contact plate, each pin pair in the plurality being laterally arranged to correspond to said terminal on the device under test;
   g. a plurality of longitudinally compressible, electrically conductive pin pairs extending through longitudinal holes in the top contact plate, the interposer and the bottom contact plate, each pin pair in the plurality being laterally arranged to correspond to said terminal on the device under test;
   wherein when a particular pin pair is longitudinally compressed, the pins in the pair slide past each other, an interface surface that is inclined with respect to a surface normal of the interposer.

2. The tester of claim 1 wherein the interposer cells are sized to receive said pin pairs and wherein upper pin includes a transverse section of greater cross section than other parts of the upper pin, and wherein said tester further includes separate anti-intrusion disks interposed between at least some of said pins between their transverse section and said elastomeric bias element, so that deflection of the upper pin is prevented from penetrating said bias element by said disk and wherein each disk is independently engagable.

3. The tester of claim 1 wherein said bias element is a resilient ring which binds the pin pairs together.

4. The tester of claim 1 wherein bias element is a plurality of resilient compressible balls surrounding the pin pairs.

5. The tester of claim 1 wherein the ball guide forms a hard stop for the DUT ball, thereby limiting deflection of the pin pairs.

6. The tester of claim 1 wherein the ball guide includes a first chamfered rim sized to receive and restrain further entry of the ball.

7. The tester of claim 1 wherein said pin pairs include an upper and lower pin and wherein said pin pairs including a sliding interlocking joint between the two to prevent separation and to maintain sliding electrical contact.

8. The tester of claim 7, wherein said sliding interlocking joint includes a land on the pin and a recess on the other pin, the land and recess sized to be in slidable and electrical engagement.

9. The test of claim 8 wherein said land and recess is a tongue and groove.

10. A test socket for testing integrated circuit devices under test (DUT) having ball contact comprising:
   a. a housing for receiving a DUT;
   b. longitudinally compressible unit, within the housing, which forms a plurality of temporary mechanical and electrical connections for use between a device under test having a plurality of terminals and a load board having a plurality of contact pads;
   c. protective ball guide having a top surface, a plurality of apertures for pins pairs, said apertures, said apertures in said top surface, at least one of said apertures including recesses sized to receive at least part a ball contact but small enough to prevent the entire DUT ball contact from passing therethrough; said recesses including a concave portion having arcuate sidewalls; said pin pairs including an upper and lower pin in slidable electrical contact, said upper pin including a transverse section having a greater cross section than other parts of the upper pin, and wherein said tester further includes singulated anti-intrusion disks interposed between at least some of said upper pins between their transverse section and said compressible unit, so that deflection of an upper pin having said disk is prevented from penetrating said compressible unit by said disk and with one disk deflection being independent of any other disk deflection.

11. The tester of claim 10 wherein the top surface of the ball guide includes metalized coating surrounding at least some of the apertures.

12. The tester of claim 11 wherein said ball guide includes electrical traces connected to said metalized coating.

13. The tester of claim 10 wherein said ball guide is resiliently deflectable.

14. The tester of claim 13 wherein said ball guide is supported by resilient springs.

15. A method of protecting test pins in a test socket from being overdriven by insertion of a device under test (DUT) having ball contacts of predetermined height, a test socket for testing integrated circuit devices under test DUT having ball contact; the test socket having a housing and protective ball guide having a top surface, comprising the steps of:
   a. forming a plurality of apertures in said ball guide, said apertures being sized to receive test pins;
   b. configuring said ball guide to be able to float up and down;
   c. locating a downward stop under said ball guide so that the downward movement of the ball guide is limited by said stop;
   d. counter-boring said apertures, adjacent said top surface to include arcuate recesses, said recesses having a depth less than the depth of height of a ball contact;
   so that said DUT are prevented from over-driving said test point by engaging said recesses.

16. The method of claim 15 including forming the recess with a beveled edge adjacent the top surface.

* * * * *